United States Patent
Park et al.

(10) Patent No.: US 12,125,869 B2
(45) Date of Patent: Oct. 22, 2024

(54) SEMICONDUCTOR LIGHT EMITTING DEVICES AND PARTITION WALL STRUCTURE, AND METHODS OF MANUFACTURING THE SAME

(71) Applicant: SAMSUNG ELECTRONICS CO., LTD., Suwon-si (KR)

(72) Inventors: Kiwon Park, Suwon-si (KR); Geunwoo Ko, Yongin-si (KR); Inho Kim, Hwaseong-si (KR); Sungwook Lee, Seoul (KR); Jonghyun Lee, Suwon-si (KR); Byungchul Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 408 days.

(21) Appl. No.: 17/542,720

(22) Filed: Dec. 6, 2021

(65) Prior Publication Data

US 2022/0199679 A1 Jun. 23, 2022

(30) Foreign Application Priority Data

Dec. 17, 2020 (KR) ........................ 10-2020-0177852

(51) Int. Cl.
*H01L 27/15* (2006.01)
(52) U.S. Cl.
CPC .................. *H01L 27/156* (2013.01)
(58) Field of Classification Search
None
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |

(Continued)

FOREIGN PATENT DOCUMENTS

| | | |
|---|---|---|
| JP | 2012-99639 A | 5/2012 |
| KR | 1020070116470 A | 12/2007 |

(Continued)

*Primary Examiner* — Nduka E Ojeh
(74) *Attorney, Agent, or Firm* — Sughrue Mion, PLLC

(57) ABSTRACT

A semiconductor light emitting device is provided. The semiconductor light emitting device includes a plurality of light emitting structures, each of which includes a first surface and a second surface, a plurality of embossed portions provided on the first surface; a partition wall structure provided on the first surface of the plurality of light emitting structures and including a plurality of partition walls which define a plurality of pixel spaces; and a fluorescent layer provided in the plurality of pixel spaces. A bottom surface of the partition wall structure contacts the plurality of embossed portions.

19 Claims, 32 Drawing Sheets

(56) References Cited

U.S. PATENT DOCUMENTS

| | | |
|---|---|---|
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,169,140 B2 | 5/2012 | Han |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,759,865 B2 | 6/2014 | Tsai et al. |
| 8,766,295 B2 | 7/2014 | Kim |
| 10,438,994 B2 | 10/2019 | Yeon et al. |
| 2017/0250316 A1* | 8/2017 | Yeon ..................... H01L 33/504 |
| 2018/0166424 A1* | 6/2018 | Sim ........................ H01L 33/54 |
| 2019/0326349 A1* | 10/2019 | Kwon ................. H01L 33/0093 |
| 2020/0258929 A1 | 8/2020 | Imoto et al. |
| 2020/0295105 A1* | 9/2020 | Ishikura ................. H05B 33/24 |
| 2021/0265420 A1* | 8/2021 | Itou ......................... H01L 33/10 |

FOREIGN PATENT DOCUMENTS

| | | |
|---|---|---|
| KR | 1020170032318 A | 3/2017 |
| KR | 1020190114822 A | 10/2019 |

* cited by examiner

B1 - B1'

B2 - B2'

SEMICONDUCTOR LIGHT EMITTING DEVICES AND PARTITION WALL STRUCTURE, AND METHODS OF MANUFACTURING THE SAME

CROSS-REFERENCE TO RELATED APPLICATION

This application claims priority from Korean Patent Application No. 10-2020-0177852, filed on Dec. 17, 2020 in the Korean Intellectual Property Office, the disclosure of which is incorporated herein by reference in its entirety.

BACKGROUND

Methods, apparatuses and systems relate to a semiconductor light emitting device and manufacturing the same, and more particularly, to a pixel-type semiconductor light emitting device and manufacturing the same.

There is an increasing demand for using semiconductor light emitting devices in various lighting devices such as vehicle headlamps or indoor lighting. For example, an intelligent lighting system has been proposed for implementing various lighting modes according to surrounding conditions by individually controlling each light emitting device chip of a light source module including a plurality of light emitting device chips. However, in order to implement such an intelligent lighting system, the optical characteristics and reliability of the light emitting device need to be improved.

SUMMARY

Example embodiments provide a pixel-type semiconductor light emitting device having excellent optical characteristics and reliability, and a method of manufacturing the same.

According to an aspect of an example embodiment, a semiconductor light emitting device includes a plurality of light emitting structures, each of which includes a first surface and a second surface, a plurality of embossed portions provided on the first surface; a partition wall structure provided on the first surface of the plurality of light emitting structures and including a plurality of partition walls which define a plurality of pixel spaces; and a fluorescent layer provided in the plurality of pixel spaces. A bottom surface of the partition wall structure contacts the plurality of embossed portions.

According to an aspect of an example embodiment, a semiconductor light emitting device includes a plurality of light emitting structures; a device separation insulating layer provided between two adjacent light emitting structures among the plurality of light emitting structures to cover sidewalls of the plurality of light emitting structures; a partition wall structure provided on the plurality of light emitting structures and the device separation insulating layer, the partition wall structure including a plurality of partition walls defining a plurality of pixel spaces, and the plurality of partition walls including a photosensitive epoxy resin; and a fluorescent layer provided in the plurality of pixel spaces. A plurality of embossed portions protruding in a direction toward the fluorescent layer are provided on the plurality of light emitting structures.

According to an aspect of an example embodiment, a semiconductor light emitting device includes a support substrate; a plurality of light emitting structures provided on the support substrate and spaced apart from each other by a device separation area; a device separation insulating layer provided in the device separation area to cover sidewalls of the plurality of light emitting structures; a partition wall structure provided on the plurality of light emitting structures and including a plurality of partition walls, wherein the plurality of partition walls define a plurality of pixel spaces, and the plurality of pixel spaces vertically overlap the plurality of light emitting structures, respectively; a fluorescent layer provided in the plurality of pixel spaces; and a pad portion provided on a side of the plurality of light emitting structures. A plurality of embossed portions which protrude in a direction toward the fluorescent layer are formed on the plurality of light emitting structures.

BRIEF DESCRIPTION OF THE DRAWINGS

Example embodiments will be more clearly understood from the following description taken in conjunction with the accompanying drawings in which.

DETAILED DESCRIPTION

Figure 1:
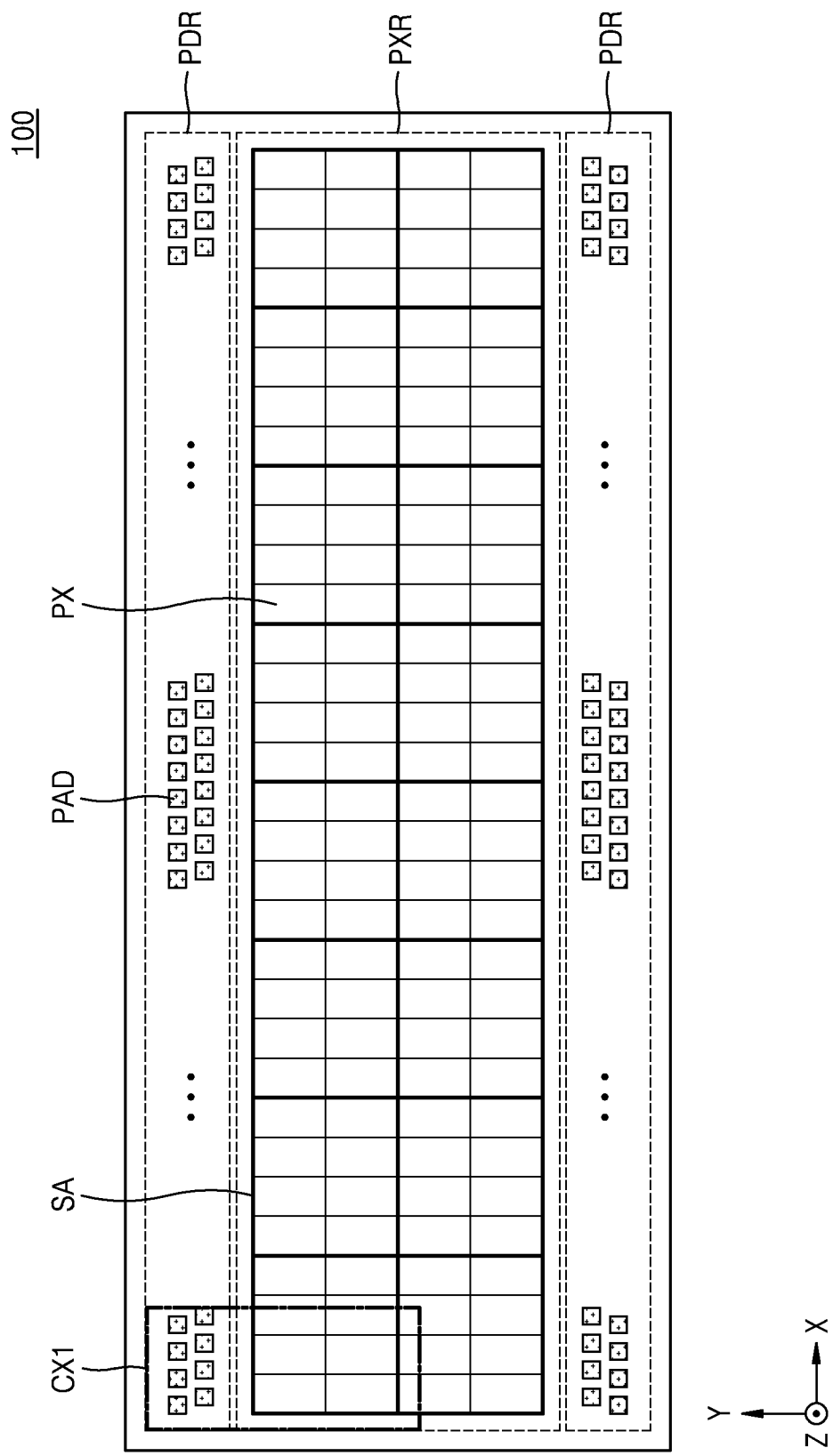
FIG. 1 is a plan view illustrating a semiconductor light emitting device according to example embodiments.

Example embodiments will be described in detail with reference to the accompanying drawings. The same reference numerals are used to indicate the same elements.

Figure 2:
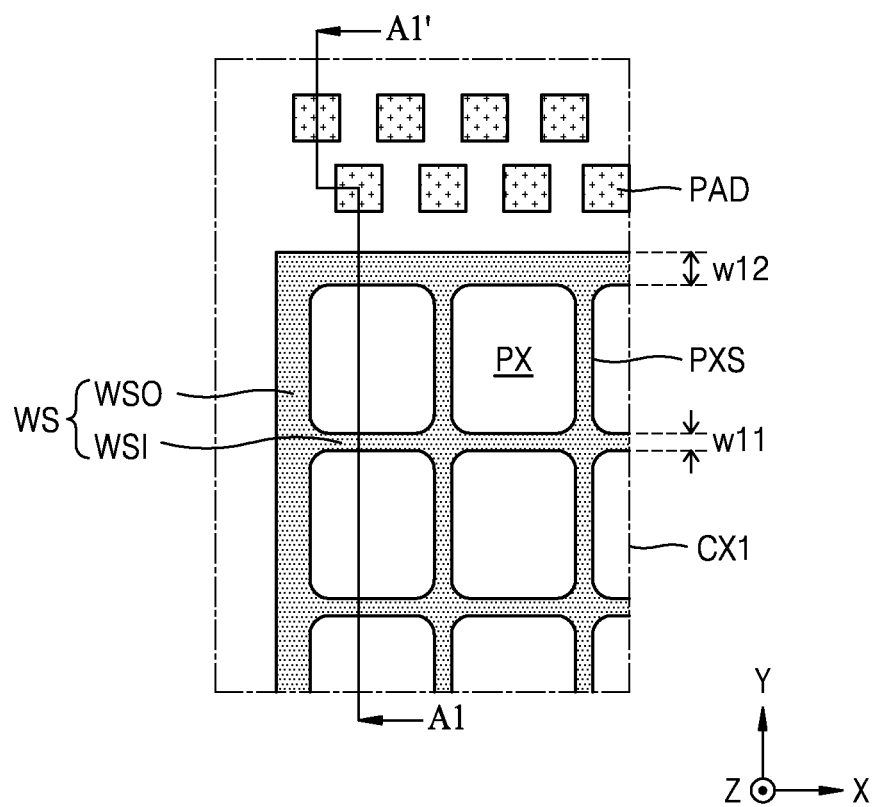
FIG. 2 is an enlarged view of a portion CX1 of FIG. 1.
Figure 3:
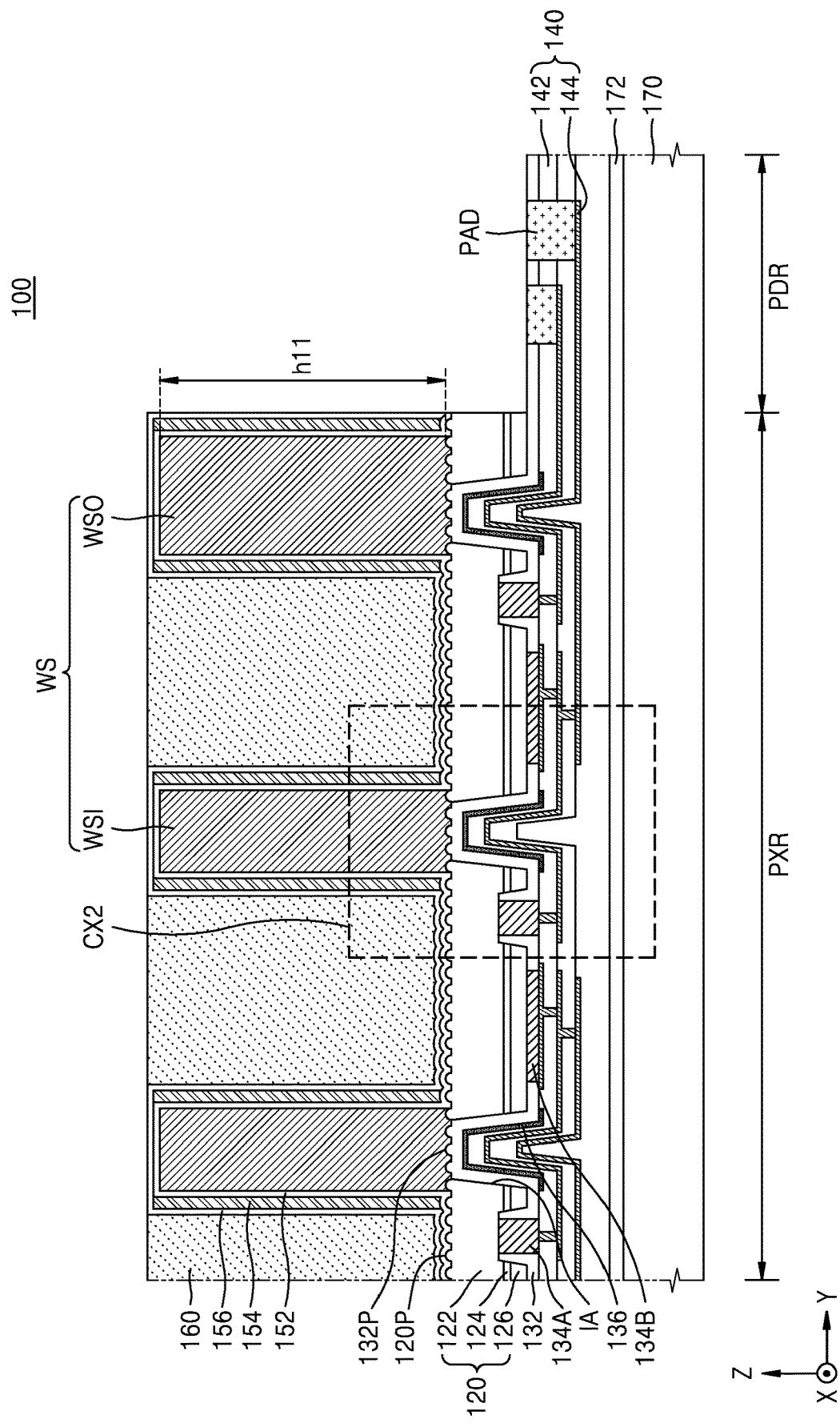
FIG. 3 is a cross-sectional view taken along line A1-A1' of FIG. 2.
Figure 4:
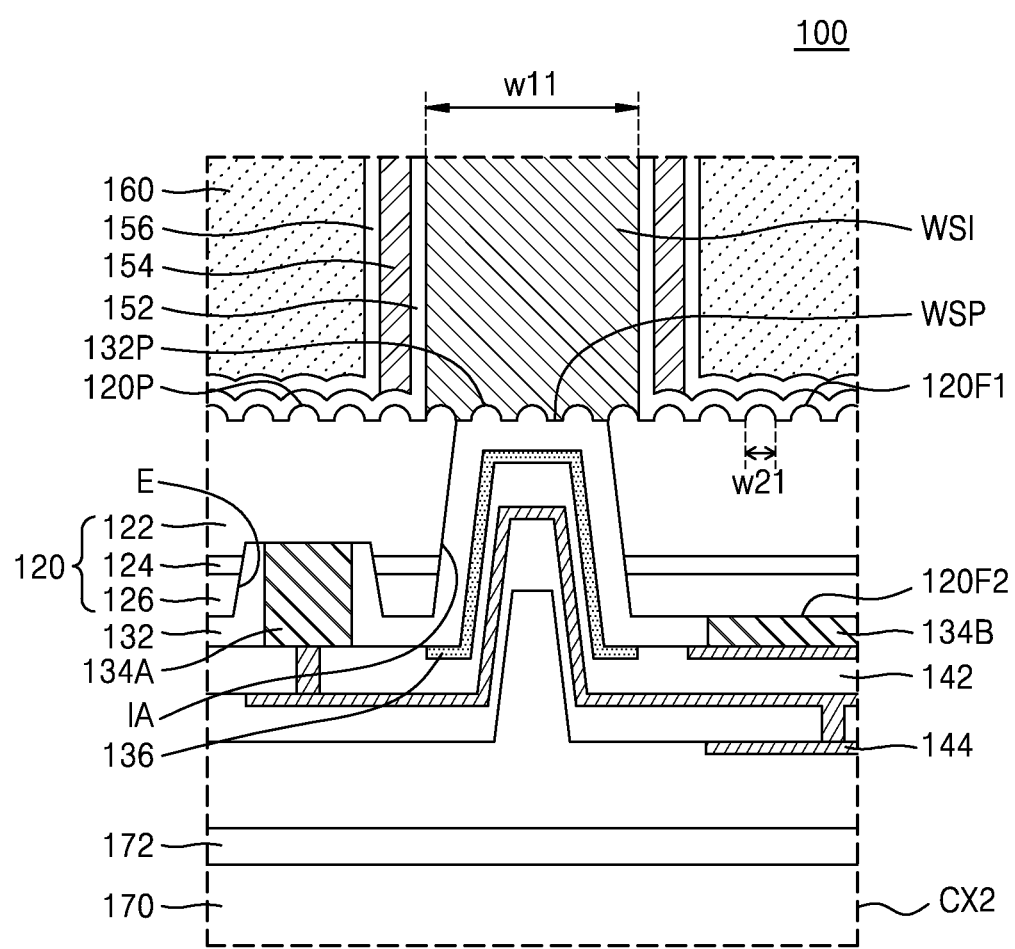
FIG. 4 is an enlarged view of a portion CX2 of FIG. 3.
Figure 5A:
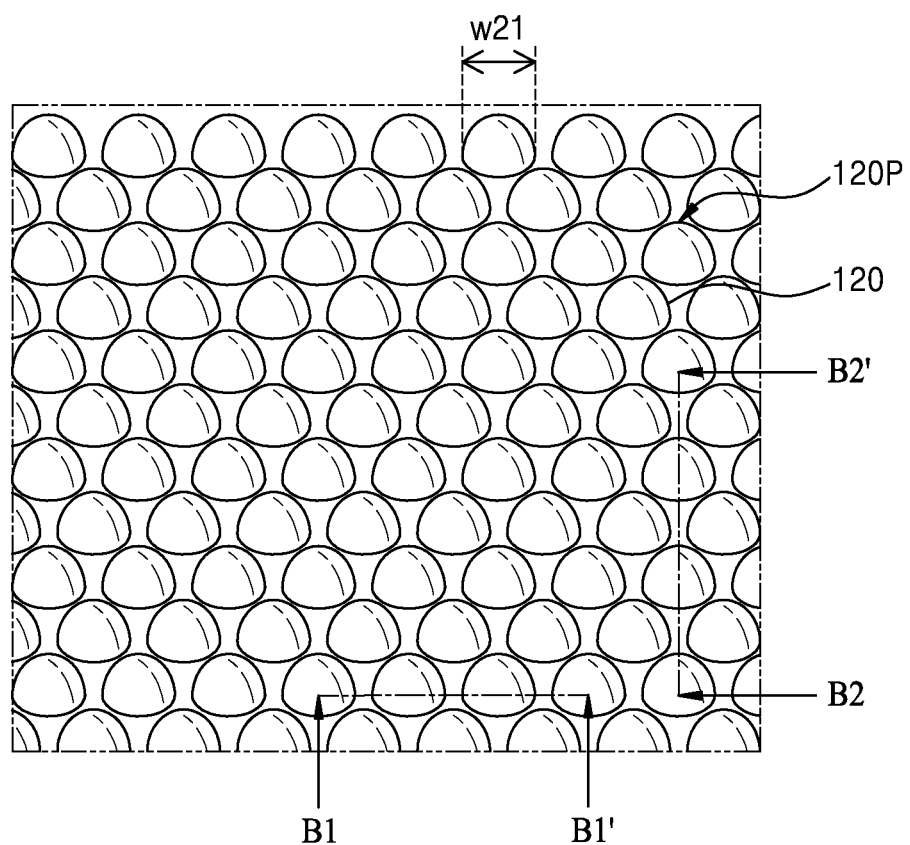
FIGS. 5A, 5B and 5C are schematic diagrams illustrating a plurality of embossed portions.
Figure 5B:
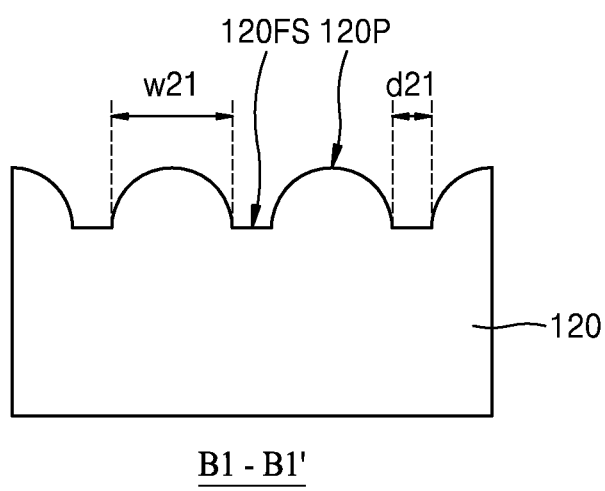
Figure 5C:
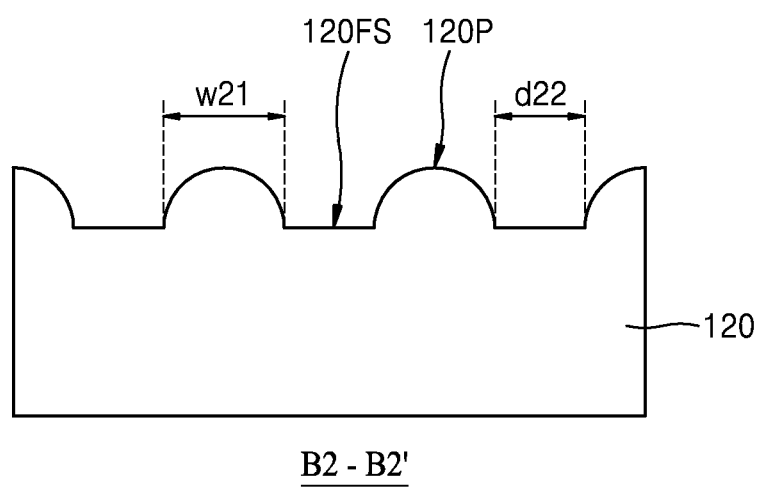

FIG. 1 is a plan view illustrating a semiconductor light emitting device 100 according to example embodiments. FIG. 2 is an enlarged view of a portion CX1 of FIG. 1, FIG. 3 is a cross-sectional view taken along line A1-A1' of FIG. 2, and FIG. 4 is an enlarged view of a portion CX2 of FIG. 3. FIGS. 5A to 5C are schematic diagrams illustrating a plurality of embossed portions 120P. Only some components of the semiconductor light emitting device 100 are shown in FIGS. 1 and 2.

Referring to FIGS. 1 to 5C, the semiconductor light emitting device 100 may include a light emitting pixel area PXR and a pad area PDR disposed on at least one side of the light emitting pixel area PXR. A plurality of pixels PX may be arranged in a matrix form on the light emitting pixel area PXR, and each of the plurality of pixels PX may include one or more light emitting structures 120. A pad portion PAD electrically connected to the light emitting structure 120 disposed in each pixel PX may be disposed on the pad area PDR.

In example embodiments, in a plan view, the light emitting pixel area PXR may have an area corresponding to about 50% to about 90% of the total area of the semiconductor light emitting device 100, and the pad area PDR may have an area corresponding to about 10% to about 50% of the total area of the semiconductor light emitting device 100, but example embodiments are not limited thereto. In a plan view, each pixel PX may have, for example, a width in the X direction or a width in the Y direction of about 10 micrometers (μm) to about several millimeters (mm), but is not limited thereto.

The semiconductor light emitting device 100 may include a plurality of sub-arrays SA, and each sub-array SA may include a plurality of pixels PX. For example, in FIG. 1, it is exemplarily shown that the semiconductor light emitting device 100 includes 16 sub-arrays SA and each sub-array SA is composed of eight pixels PX arranged in a matrix form. However, the arrangement of the sub-arrays SA and the number of pixels PX included in each of the plurality of sub-arrays SA may vary.

In example embodiments, each of the plurality of sub-arrays SA may be electrically separated from each other, and the plurality of pixels PX included in one sub-array SA may be connected to each other in series. For example, each of the plurality of pixels PX provided in one sub-array SA may be electrically connected to the same driving chip, so that one driving chip may be configured to control one sub-array SA. In this case, the number of the plurality of sub-arrays SA and the number of driving chips may be the same. In other example embodiments, the pixels PX included in at least one sub-array SA among the plurality of sub-arrays SA may be connected in parallel to each other.

A partition wall structure WS may be disposed on the plurality of light emitting structures 120. As exemplarily shown in FIG. 2, the partition wall structure WS may include a plurality of partition walls WSI defining a plurality of pixel spaces PXS within the pixel area PXR, and a peripheral partition wall WSO disposed at the outermost portion of the partition wall structure WS to be connected to the plurality of partition walls WSI. The pixels PX may be disposed in each of the plurality of pixel spaces PXS.

Each of the plurality of partition walls WSI may have a first width w11 ranging from about 10 μm to about 100 μm between pixels along the horizontal directions (i.e., the X and Y directions). The peripheral partition wall WSO may have a second width w12 ranging from about 10 μm to about 1 mm along the horizontal directions (i.e., the X and Y directions). The partition wall structure WS may be formed such that the peripheral partition wall WSO has a second width w12 greater than the first width w11 of the plurality of partition walls WSI, and thus, structural stability of the semiconductor light emitting device 100 may be improved. For example, even in an environment where repeated vibrations and shocks are applied, such as when the semiconductor light emitting device 100 is used as a vehicle headlamp, reliability of the semiconductor light emitting device 100 may be improved due to the excellent structural stability between the partition wall structure WS and the fluorescent layer 160 disposed inside the partition wall structure WS.

The plurality of light emitting structures 120 may include a first conductivity type semiconductor layer 122, an active layer 124, and a second conductivity type semiconductor layer 126. The plurality of light emitting structures 120 may include a first surface 120F1 and a second surface 120F2 opposite to each other. An area between two adjacent light emitting structures 120 among the plurality of light emitting structures 120 may be referred to as a device separation area IA, and for example, a plurality of partition walls WSI may be disposed to vertically overlap the device separation area IA.

The surface of the light emitting structure 120 facing the plurality of partition walls WSI may be referred to as the first surface 120F1 of the light emitting structure 120, and the surface of the light emitting structure 120 opposite to the first surface 120F1 of the light emitting structure 120 (i.e., a surface of the light emitting structure 120 disposed away from a plurality of partition walls WSI) may be referred to as the second surface 120F2 of the light emitting structure 120. For example, the first conductivity type semiconductor layer 122, the active layer 124, and the second conductivity type semiconductor layer 126 may be stacked in the vertical direction from the first surface 120F1 to the second surface 120F2 of the light emitting structure 120, and accordingly, the first surface 120F1 of the light emitting structure 120 may correspond to the upper surface of the first conductivity type semiconductor layer 122, and the second surface 120F2 of the light emitting structure 120 may correspond to the bottom surface of the second conductivity type semiconductor layer 126.

The first conductivity type semiconductor layer 122 may be a nitride semiconductor having a composition of n-type $In_xAl_yGa_{(1-x-y)}N$ ($0 \leq x \leq 1$, $0 \leq y \leq 1$, $0 \leq x+y < 1$), and for example, the n-type impurity may be silicon (Si). For example, the first conductivity type semiconductor layer 122 may include GaN including n-type impurities.

In example embodiments, the first conductivity type semiconductor layer 122 may include a first conductivity type semiconductor contact layer and a current diffusion layer. The impurity concentration of the first conductivity type semiconductor contact layer may be in a range of about $2 \times 10^{18}$ cm$^{-3}$ to about $9 \times 10^{19}$ cm$^{-3}$. The thickness of the first conductivity type semiconductor contact layer may be about 1 μm to about 5 μm. The current diffusion layer may have a structure in which a plurality of $In_xAl_yGa_{(1-x-y)}N$ ($0 \leq x, y \leq 1$, $0 \leq x+y \leq 1$) layers having different compositions or different impurity contents are alternately stacked. For example, the current diffusion layer may have an n-type superlattice structure in which an n-type GaN layer and/or an $Al_xIn_yGa_zN$ layer ($0 \leq x,y,z \leq 1$, $x+y+z \neq 0$) each having a thickness of about 1 nm to about 500 nm are alternately stacked. The impurity concentration of the current diffusion layer may be about $2 \times 10^{18}$ cm$^{-3}$ to about $9 \times 10^{19}$ cm$^{-3}$.

The active layer 124 may be disposed between the first conductivity type semiconductor layer 122 and the second conductivity type semiconductor layer 126. The active layer 124 may be configured to emit light having a predetermined energy by recombination of electrons and holes when the semiconductor light emitting device 100 is driven. The active layer 124 may have a multiple quantum well (MQW) structure in which quantum well layers and quantum barrier layers are alternately stacked. For example, the quantum well layer and the quantum barrier layer may include $In_xAl_yGa_{(1-x-y)}N$ ($0 \leq x$, $y \leq 1$, $0 \leq x+y \leq 1$) having different compositions. For example, the quantum well layer may include $In_xGa_{1-x}N$ ($0 \leq x \leq 1$), and the quantum barrier layer may be GaN or AlGaN. The thickness of the quantum well layer and the quantum barrier layer may each range from about 1 nm to about 50 nm. The active layer 124 is not limited to a MQW structure, but may be a single quantum well structure.

The second conductivity type semiconductor layer 126 may be a nitride semiconductor layer having a composition of p-type $In_xAl_yGa_{(1-x-y)}N$ ($0 \leq x < 1$, $0 \leq y < 1$, $0 \leq x+y < 1$), and for example, the p-type impurity may be magnesium (Mg).

In example embodiments, the second conductivity type semiconductor layer 126 may include an electron blocking layer, a low-concentration p-type GaN layer, and a high-concentration p-type GaN layer, which are stacked in a vertical direction. For example, the electron blocking layer may have a structure in which a plurality of $In_xAl_yGa_{(1-x-y)}N$ ($0 \leq x$, $y \leq 1$, $0 \leq x+y \leq 1$) of different compositions each having a thickness of about 5 nm to about 100 nm are alternately stacked, or may be a single layer composed of $Al_yGa_{(1-y)}N$ ($0 < y \leq 1$). The energy band gap of the electron blocking layer may decrease as the distance from the active layer 124 increases. For example, the Al composition of the electron blocking layer may decrease as the distance from the active layer 124 increases.

A device separation insulating layer 132 may be disposed on the second surface 120F2 of the plurality of light emitting structures 120. The device separation insulating layer 132 may be conformally disposed to cover each side of the plurality of light emitting structures 120 on the inner wall of the device separation area IA. In addition, the device separation insulating layer 132 may be disposed on the inner wall of the opening portion E penetrating the active layer 124 and the second conductivity type semiconductor layer 126. In example embodiments, the device separation insulating layer 132 may include silicon oxide, silicon oxynitride, or silicon nitride. In some example embodiments, the device separation insulating layer 132 may be formed in a stacked structure of a plurality of insulating layers.

The first contact 134A may be disposed to be connected to the first conductivity type semiconductor layer 122 in the opening portion E penetrating the active layer 124 and the second conductivity type semiconductor layer 126. The second contact 134B may be disposed on the bottom surface of the second conductivity type semiconductor layer 126. The device separation insulating layer 132 may electrically insulate the first contact 134A from the active layer 124 and the second conductivity type semiconductor layer 126. The device separation insulating layer 132 may be disposed between the first contact 134A and the second contact 134B on the bottom surface of the second conductivity type semiconductor layer 126, and may electrically insulate the first contact 134A from the second contact 134B. The first contact 134A and the second contact 134B may include Ag, Al, Ni, Cr, Au, Pt, Pd, Sn, W, Rh, Ir, Ru, Mg, Zn, Ti, Cu, and combinations thereof. The first contact 134A and the second contact 134B may include a metallic material having high reflectivity.

The lower reflector layer 136 may be disposed on the device separation insulating layer 132 disposed on the inner wall of the device separation area IA. The lower reflector layer 136 may serve to reflect light emitted through sidewalls of the plurality of light emitting structures 120 and redirect the reflected light into the plurality of pixel spaces PXS.

In example embodiments, the lower reflector layer 136 may include Ag, Al, Ni, Cr, Au, Pt, Pd, Sn, W, Rh, Ir, Ru, Mg, Zn, Ti, Cu, and combinations thereof. The lower reflector layer 136 may include a metallic material having high reflectivity. In other example embodiments, the lower reflector layer 136 may be a distributed Bragg reflector. For example, the distributed Bragg reflector may have a structure in which a plurality of insulating layers having different refractive indices are repeatedly stacked. Each insulating layer included in the distributed Bragg reflector may include oxides or nitrides such as $SiO_2$, SiN, $SiO_xN_y$, $TiO_2$, $Si_3N_4$, $Al_2O_3$, TiN, AlN, $ZrO_2$, TiAlN, TiSiN, and combinations thereof.

The wiring structure 140 may be disposed on the device separation insulating layer 132, the first contact 134A, the second contact 134B, and the lower reflector layer 136. The wiring structure 140 may include a plurality of insulating layers 142 and a plurality of wiring layers 144. The plurality of wiring layers 144 may electrically connect the first contact 134A and the second contact 134B to the pad portion PAD, respectively. A portion of the plurality of wiring layers 144 may be disposed on the inner wall of the device separation area IA, and the plurality of insulating layers 142 may cover each of the plurality of wiring layers 144 and fill the device separation area IA. As exemplarily shown in FIG. 3, the plurality of wiring layers 144 may include two or more wiring layers 144 disposed at different levels in a vertical direction, but are not limited thereto. Each of the plurality of wiring layers 144 may include Ag, Al, Ni, Cr, Au, Pt, Pd, Sn, W, Rh, Ir, Ru, Mg, Zn, Ti, Cu, and combinations thereof.

In example embodiments, the plurality of light emitting structures 120 included in one sub-array SA are configured to be connected in series, and the plurality of wiring layers 144 may electrically connect a first contact 134A of one light emitting structure 120 to a second contact 134B of another light emitting structure 120 connected in series thereto.

A pad portion PAD connected to the plurality of wiring layers 144 may be disposed on the pad area PDR, and may be disposed at a lower vertical level than the partition wall structure WS. In example embodiments, the sidewall and the bottom surface of the pad portion PAD are covered by the plurality of insulating layers 142, and the upper surface of the pad portion PAD may be disposed at a lower level than the upper surface of the plurality of light emitting structures 120. In other example embodiments, a portion of the plurality of light emitting structures 120 may be disposed in the pad area PDR, and the pad portion PAD may be disposed in an opening portion formed on the plurality of light emitting structures 120, and in this case, the upper surface of the pad portion PAD may be disposed at the same level as the upper surface of the plurality of light emitting structures 120. A connection member such as a bonding wire for electrical connection with a driving semiconductor chip may be disposed on the pad portion PAD.

A partition wall structure WS may be disposed on an upper surface of the plurality of light emitting structures 120. In some example embodiments, the partition wall structure WS may include a negative type photosensitive material or a positive type photosensitive material. In some example embodiments, the partition wall structure WS may include a photosensitive epoxy resin. However, the material of the partition wall structure WS is not limited thereto, and the partition wall structure WS may be formed using another suitable material having structural stability and adhesion to the plurality of light emitting structures 120.

In example embodiments, a preliminary partition wall layer WSL is formed by coating, applying, or attaching a photosensitive epoxy resin on the first surface 120F1 of the plurality of light emitting structures 120 on which a plurality of embossed portions 120P are formed on the first surface 120F1 of the plurality of light emitting structures 120 by a dry texturing process, and the partition wall structure WS may be formed by removing a partial area of the preliminary partition wall layer WSL using a photolithography process.

A plurality of partition walls WSI may be arranged in a matrix form in a plan view, and a plurality of pixel spaces PXS may be defined by the plurality of partition walls WSI. Each of the plurality of partition walls WSI may vertically overlap the device separation area IA, and the bottom surface of each of the plurality of partition walls WSI may contact the upper surface of the device separation insulating layer 132. For example, as shown in FIG. 4, the first width w11 of each of the plurality of partition walls WSI may be formed to be greater than the width of the device separation area IA, and accordingly, a portion of the bottom surface of each of the plurality of partition walls WSI may contact the upper surface of the device separation insulating layer 132, and another portion of the bottom surface of each of the plurality of partition walls WSI may contact the first surface 120F1 of the plurality of light emitting structures 120. However, example embodiments are not limited thereto and the first width w11 of each of the plurality of partition walls WSI may be less than or equal to the width of the device separation area IA.

In example embodiments, the partition wall structure WS has a first height h11 in a direction perpendicular to the first surface 120F1 of the plurality of light emitting structures 120, and the first height h11 may be about 5 micrometers to about 300 micrometers. When the first height h11 is less than about 5 micrometers, light from one pixel space PXS may be emitted into an adjacent pixel space PXS, thereby deteriorating contrast characteristics of the semiconductor light emitting device.

The upper surfaces of the plurality of light emitting structures 120 may be exposed to the bottom portion of the plurality of pixel spaces PXS. For example, a plurality of embossed portions 120P may be formed on upper surfaces of the plurality of light emitting structures 120 disposed on the bottom portion of the plurality of pixel spaces PXS. Light extraction efficiency from the plurality of light emitting structures 120 may be improved by the plurality of embossed portions 120P.

In example embodiments, the plurality of embossed portions 120P may be arranged with regularity, and the size of each of the plurality of embossed portions 120P may be uniform. For example, as exemplarily shown in FIGS. 5A to 5C, the plurality of embossed portions 120P may be arranged in a hexagonal structure in plan view, and may have a hemispherical shape protruding upward from the reference upper surface 120FS provided on the first surface 120F1 (e.g., in the direction toward the fluorescent layer 160 or toward the partition wall structure WS).

In example embodiments, each of the plurality of embossed portions 120P may have a first width w21 along a horizontal direction parallel to the first surface 120F1, and the first width w21 may be about 50 nanometers to about 20 micrometers. In example embodiments, the plurality of embossed portions 120P may be disposed to be spaced apart by a first distance d21 along the closest direction as shown in FIG. 5B, and the first distance d21 may be about 0 micrometers to about 20 micrometers. For example, when the first distance d21 is about 0 micrometers, two adjacent embossed portions 120P among the plurality of embossed portions 120P may have ends connected to each other. The plurality of embossed portions 120P may be disposed to be spaced apart by a second distance d22 along a direction different from the nearest direction as shown in FIG. 5C, and the second distance d22 may be greater than the first distance d21.

In example embodiments, the plurality of embossed portions 120P may be manufactured by a dry texturing process in which a mask pattern M11 (see FIG. 18) including a photoresist material is formed on the first surface 120F1 of the plurality of light emitting structures 120, and the shape of the mask pattern M11 is transferred to the embossed portions 120P of the plurality of light emitting structures 120. By the dry texturing process, the first width w21 and the first distance d21 of the plurality of embossed portions 120P may be precisely adjusted, and accordingly, light extraction efficiency from the plurality of light emitting structures 120 may be improved.

The device separation insulating layer 132 disposed in the device separation area IA between two adjacent light emitting structures 120 among the plurality of light emitting structures 120 may include a plurality of protrusion portions 132P. In example embodiments, the plurality of protrusion portions 132P may be formed to have the same shape as the plurality of embossed portions 120P. In other example embodiments, the plurality of protrusion portions 132P may be formed to have a smaller height than the plurality of embossed portions 120P. In the process of forming the plurality of embossed portions 120P by the dry texturing process, the plurality of protrusion portions 132P may be formed by removing a portion of the upper surface of the device separation insulating layer 132 that is not covered by the mask pattern M11.

The bottom surface of the partition wall structure WS may contact the plurality of embossed portions 120P and the plurality of protrusion portions 132P, and the partition wall structure WS may include a protrusion portion WSP having a shape conforming to shapes of the plurality of embossed portions 120P and the plurality of protrusion portions 132P.

A first insulating layer 152 may be disposed on an upper surface and a sidewall of each of the plurality of partition walls WSI. The first insulating layer 152 may be disposed to cover the first surfaces 120F1 of the plurality of light emitting structures 120 in the bottom portion of the plurality of pixel spaces PXS. The first insulating layer 152 may conformally cover the upper surface and the reference upper surface 120FS of the plurality of embossed portions 120P. The sidewall reflector layer 154 may cover sidewalls of each of the plurality of partition walls WSI on the first insulating layer 152. The sidewall reflector layer 154 may serve to reflect light emitted from the plurality of light emitting structures 120. The sidewall reflector layer 154 may not be disposed in the bottom portion of the plurality of pixel spaces PXS. The second insulating layer 156 may be conformally disposed on an upper surface and sidewalls of each of the plurality of partition walls WSI, and may cover the first insulating layer 152 and the sidewall reflector layer 154.

In example embodiments, the first insulating layer 152 and the second insulating layer 156 may include at least one of silicon oxide, silicon nitride, silicon oxynitride, aluminum oxide, and aluminum nitride. In example embodiments, at least one of the first insulating layer 152 and the second insulating layer 156 may be formed in a stacked structure of a plurality of material layers, and for example, may be configured in a laminated structure of $SiO_2/Al_2O_3/SiO_2/Al_2O_3$, $SiON/Al_2O_3/SiON/Al_2O_3$, $SiN_x/Al_2O_3/SiN_x/Al_2O_3$, $Al_2O_3/SiO_2/Al_2O_3/SiO_2$, $Al_2O_3/SiON/Al_2O_3/SiON$, $Al_2O_3/SiN_x/Al_2O_3/SiN_x$, $SiO_2/AlN/SiO_2/AlN$, $SiON/AlN/SiON/AlN$, $SiN_x/AlN/SiN_x/AlN$, $SiO_2/SiN_x/SiO_2/SiN_x$, and $Al_2O_3/AlN/Al_2O_3/AlN$.

In example embodiments, the sidewall reflector layer 154 may be a metal layer including Ag, Al, Ni, Cr, Au, Pt, Pd, Sn, W, Rh, Ir, Ru, Mg, Zn, and combinations thereof. In other example embodiments, the sidewall reflector layer 154 may be a resin layer such as polyphthalamide (PPA) including a metal oxide such as titanium oxide or aluminum oxide. In other example embodiments, the sidewall reflector layer 154 may be a distributed Bragg reflector layer. For example, the distributed Bragg reflector layer may have a structure in which a plurality of insulating films having different refractive indices are repeatedly stacked several to hundreds of times. Each insulating filmi included in the distributed Bragg reflector layer may include oxides or nitrides such as $SiO_2$, SiN, $SiO_xN_y$, $TiO_2$, $Si_3N_4$, $Al_2O_3$, TiN, AN, $ZrO_2$, TiAlN, and TiSiN and combinations thereof.

A fluorescent layer 160 may be disposed inside the plurality of pixel spaces PXS on the upper surface of the plurality of light emitting structures 120. As exemplarily illustrated in FIG. 3, the fluorescent layer 160 may substantially fill the entire space of the plurality of pixel spaces PXS on the second insulating layer 156. The upper surface of the fluorescent layer 160 may be disposed at the same level as the upper surface of the plurality of partition walls WSI, but is not limited thereto.

The fluorescent layer 160 may be a single type of material capable of converting light emitted from the light emitting structure 120 into a desired color, and that is, the fluorescent layer 160 related to the same color may be disposed inside the plurality of pixel spaces PXS. However, example embodiments are not limited thereto. The color of the fluorescent layer 160 disposed in some of the pixel spaces PXS among the plurality of pixel spaces PXS may be different from the color of the fluorescent layer 160 disposed in the remaining pixel spaces PXS.

The fluorescent layer 160 may include a resin in which a phosphor is dispersed or a film including a phosphor. For example, the fluorescent layer 160 may include a phosphor film in which phosphor particles are uniformly dispersed at a predetermined concentration. The phosphor particles may be a wavelength converting material that converts the wavelength of light emitted from the plurality of light emitting structures 120. In order to improve the density and color uniformity of the phosphor particles, the fluorescent layer 160 may include two or more types of phosphor particles having different size distributions.

In example embodiments, the phosphor may have various compositions and colors such as oxide-based, silicate-based, nitride-based, and fluorite-based. For example, as the phosphor, β-SiAlON:$Eu^{2+}$ (green), (Ca,Sr)AlSiN$_3$:$Eu^{2+}$ (red), $La_3Si_6N_{11}$:$Ce^{3+}$ (yellow), $K_2SiF_6$:$Mn_4^+$ (red), $SrLiAl_3N_4$:Eu (red), $Ln_{4-x}(Eu_zM_{-z})_xSi_{12-y}Al_yO_{3+x+y}N_{18-x-y}$ (0.5≤x≤3, 0<z<0.3, 0<y≤4)(red), $K_2TiF_6$:$Mn_4^+$(red), $NaYF_4$:$Mn_4^+$ (red), $NaGdF_4$:$Mn_4^+$(red), and the like may be used. However, the type of the phosphor is not limited to the above.

In other example embodiments, a wavelength converting material such as a quantum dot may be further provided in the fluorescent layer 160. The quantum dots may have a core-shell structure using a III-V or II-VI compound semiconductor, and for example, may have a core such as CdSe and InP and a shell such as ZnS and ZnSe. In addition, the quantum dot may include a ligand for stabilizing the core and the shell.

A support substrate 170 may be disposed on the wiring structure 140, and an adhesive layer 172 may be disposed between the support substrate 170 and the wiring structure 140. In example embodiments, the adhesive layer 172 may include an electrically insulating material, for example, silicon oxide, silicon nitride, a polymer material such as a UV curable material, or resins. In some example embodiments, the adhesive layer 172 may include a eutectic adhesive material such as AuSn or NiSi. The support substrate 170 may include a sapphire substrate, a glass substrate, a transparent conductive substrate, a silicon substrate, a silicon carbide substrate, but is not limited thereto.

In general, a light source module including a plurality of light emitting device chips is used for an intelligent lighting system such as a vehicle headlamp, and by individually controlling each light emitting device chip, various lighting modes may be implemented according to the surrounding environment. When using a plurality of light emitting devices arranged in a matrix form, light emitted from each of the plurality of light emitting devices may be mixed or be emitted into adjacent light emitting devices, and the contrast characteristics of the light source module may not be excellent. However, according to example embodiments, mixing or penetrating from the pixel PX to the adjacent pixel PX may be reduced or prevented by forming the partition wall structure WS on the plurality of light emitting structures 120. In addition, the fluorescent layer 160 may be firmly fixed within each pixel space PXS by the partition wall structure WS, and even in environments where repeated vibrations and shocks are applied, such as the semiconductor light emitting device 100 used as a vehicle headlamp, reliability of the semiconductor light emitting device 100 may be improved.

A method of forming the partition wall structure by patterning a growth substrate such as silicon has been proposed, but in such a method, the partition wall structure is patterned to form a pixel space, and in order to improve light extraction, an uneven portion is formed on the first surface of the light emitting structure exposed to the bottom portion of the pixel space by a wet etching process. In this case, there is a problem in that it is difficult to control the shape and depth of the uneven portion, and there is a limitation in improving light extraction of the light emitting structure.

However, according to example embodiments, after removing all the growth substrates and exposing the flat upper surface of the light emitting structure 120, the plurality of embossed portions 120P having a precisely controlled size and shape may be formed on the upper surface by dry texturing using a mask pattern. Accordingly, light extraction efficiency from the light emitting structure 120 may be improved, and the semiconductor light emitting device 100 may have excellent light emission quality.

Figure 6:
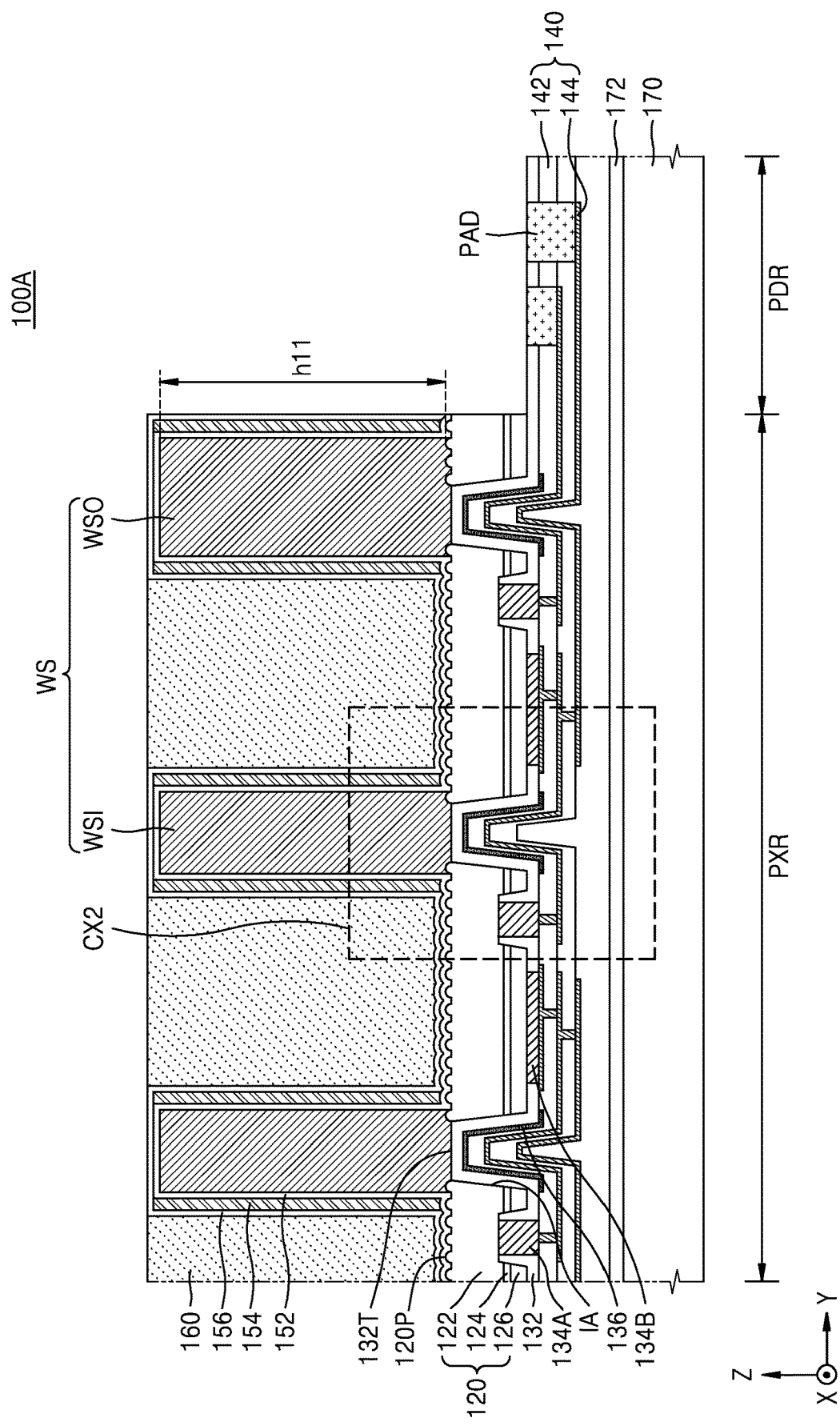
FIG. 6 is a cross-sectional view illustrating a semiconductor light emitting device according to example embodiments.
Figure 7:
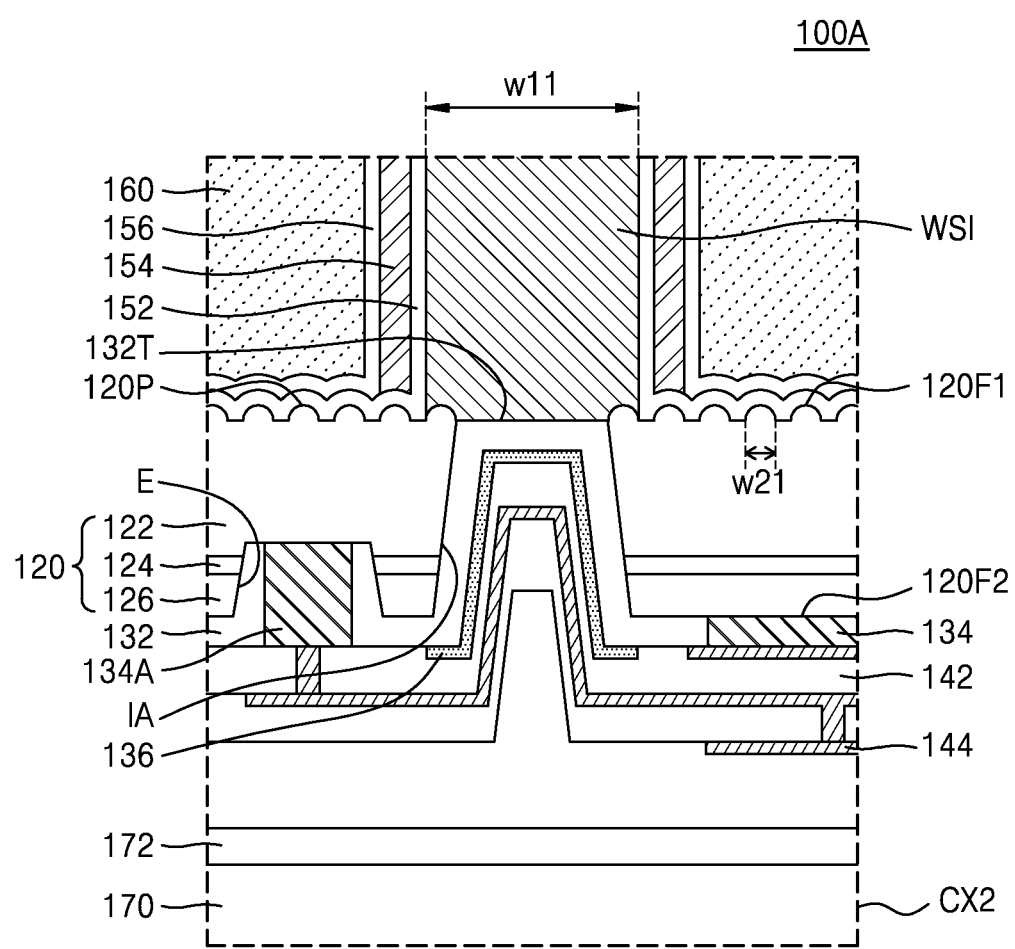
FIG. 7 is an enlarged view of a portion CX2 of FIG. 6.

FIG. 6 is a cross-sectional view illustrating a semiconductor light emitting device 100A according to example embodiments, and FIG. 7 is an enlarged view of a portion CX2 of FIG. 6. In FIGS. 6 and 7, the same reference numerals as in FIGS. 1 to 5C denote the same components.

Referring to FIGS. 6 and 7, the device separation insulating layer 132 may have a flat upper surface 132T. The bottom surface of the partition wall structure WS in contact with the flat upper surface 132T of the device separation insulating layer 132 may also be flat.

In example embodiments, as shown in FIG. 7, the first width w11 of each of the plurality of partition walls WSI may be formed to be greater than the width of the device separation area IA, and accordingly, the central portion of the bottom surface of each of the plurality of partition walls WSI may contact the flat upper surface 132T of the device separation insulating layer 132, and an edge portion of the bottom surface of each of the plurality of partition walls WSI may contact the first surface 120F1 (e.g., the plurality of embossed portions 120P) of the plurality of light emitting structures 120. However, example embodiments are not limited thereto and the first width w11 of each of the plurality of partition walls WSI may be less than or equal to the width of the device separation area IA, and in this case, the total area of the bottom surface of each of the plurality of partition walls WSI may contact the flat upper surface 132T of the device separation insulating layer 132.

In example embodiments, the plurality of embossed portions 120P may be manufactured by a dry texturing process in which a mask pattern M12 (see FIG. 25) including a photoresist material is formed on the first surface 120F1 of the plurality of light emitting structures 120, and the shape of the mask pattern M12 is transferred to the embossed portions 120P of the plurality of light emitting structures 120. When the mask pattern M12 used in the dry texturing process exposes the entire upper surface of the device separation insulating layer 132 (or vice versa when covering the entire upper surface of the device separation insulating layer 132), the device separation insulating layer 132 may be formed to have a flat upper surface 132T.

Figure 8:
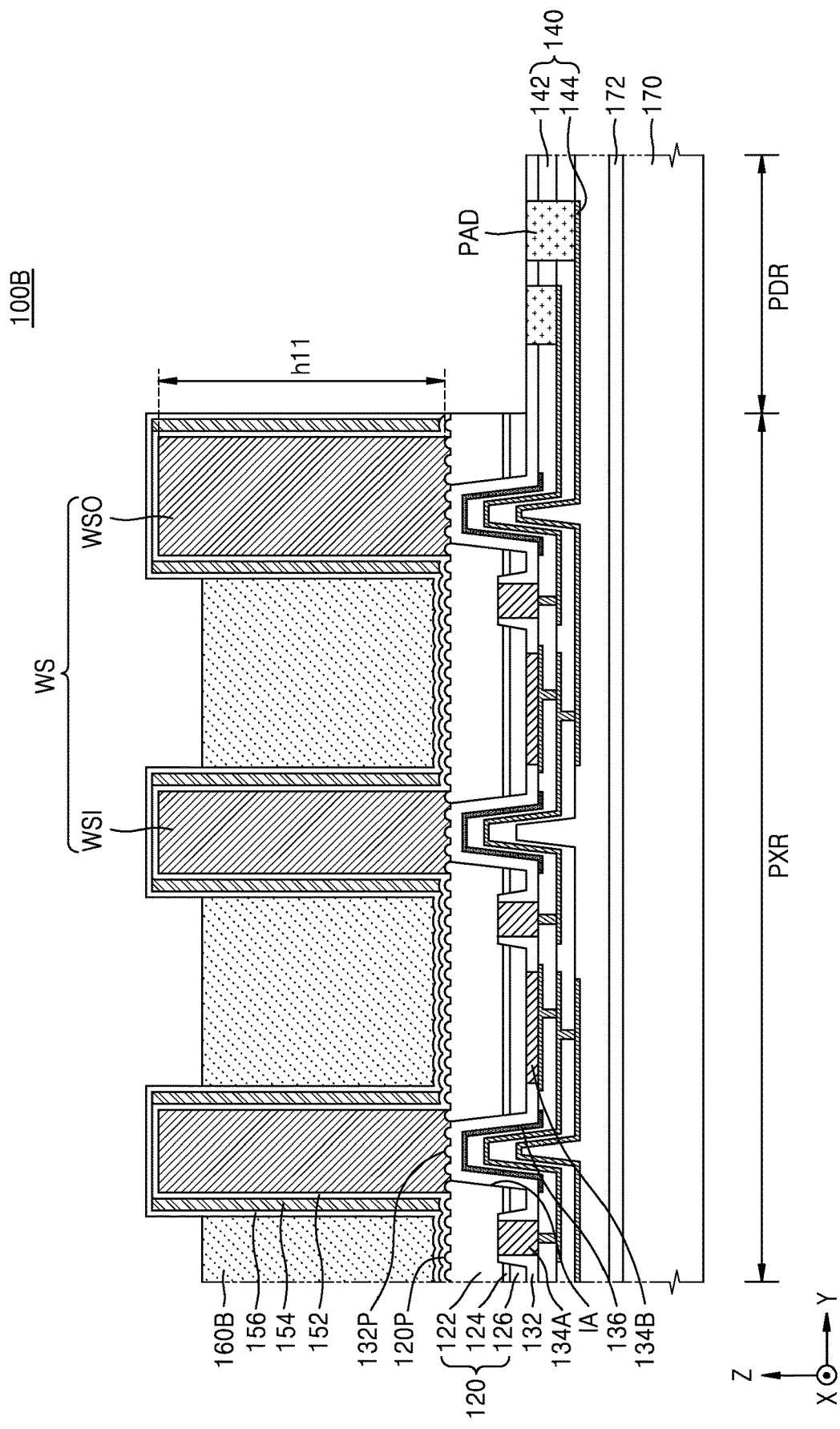
FIG. 8 is a cross-sectional view illustrating a semiconductor light emitting device according to example embodiments.

FIG. 8 is a cross-sectional view illustrating a semiconductor light emitting device 100B according to example embodiments. In FIG. 8, the same reference numerals as in FIGS. 1 to 7 denote the same components.

Referring to FIG. 8, the fluorescent layer 160B may have an upper surface disposed at a lower level than a plurality of partition walls WSI. For example, a difference in height between the upper surface of the fluorescent layer 160B and the upper surface of the plurality of partition walls WSI may be about 0.1 micrometers to about 50 micrometers. In example embodiments, a height of the fluorescent layer 160B included in some of the pixels PX may be different from a height of the fluorescent layer 160B included in the other pixels PX.

Figure 9:
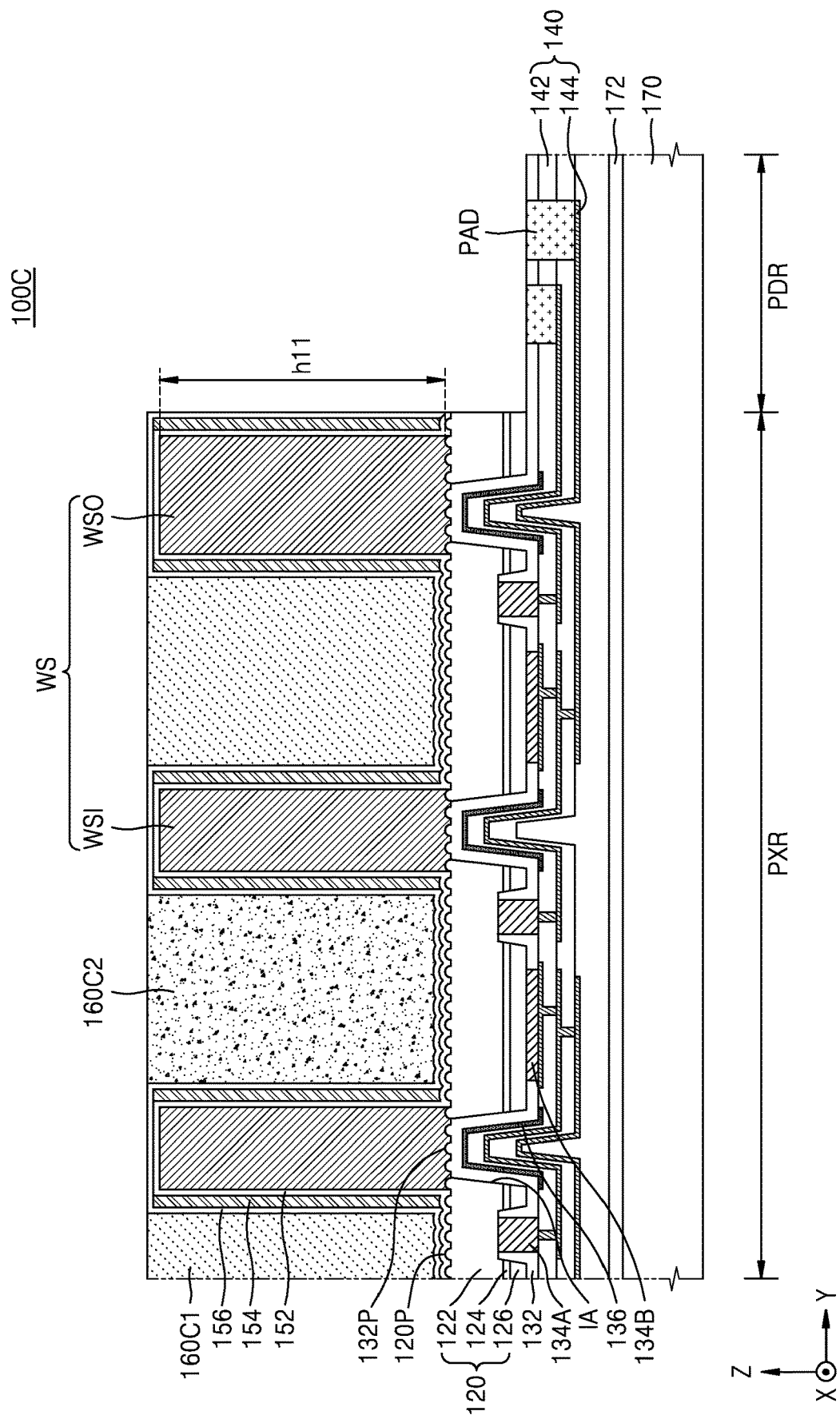
FIG. 9 is a cross-sectional view illustrating a semiconductor light emitting device according to example embodiments.

FIG. 9 is a cross-sectional view illustrating a semiconductor light emitting device 100C according to example embodiments. In FIG. 9, the same reference numerals as in FIGS. 1 to 8 denote the same components.

Referring to FIG. 9, some of the pixels PX may include a first fluorescent layer 160C1 and other pixels PX may include a second fluorescent layer 160C2. In example embodiments, the composition of the phosphor included in the first fluorescent layer 160C1 may be different from the composition of the phosphor included in the second fluorescent layer 160C2. For example, the color of light emitted from the pixel PX including the first fluorescent layer 160C1 may be different from the color of light emitted from the pixel PX including the second fluorescent layer 160C2. In example embodiments, the size of the phosphor included in the first fluorescent layer 160C1 may be different from the size of the phosphor included in the second fluorescent layer 160C2. In example embodiments, the first fluorescent layer 160C1 may include a single type of phosphor particles, and the second fluorescent layer 160C2 may include two or more types of phosphor particles having different size distributions. In example embodiments, the color temperature of the first fluorescent layer 160C1 may be different from the color temperature of the second fluorescent layer 160C2.

Figure 10:
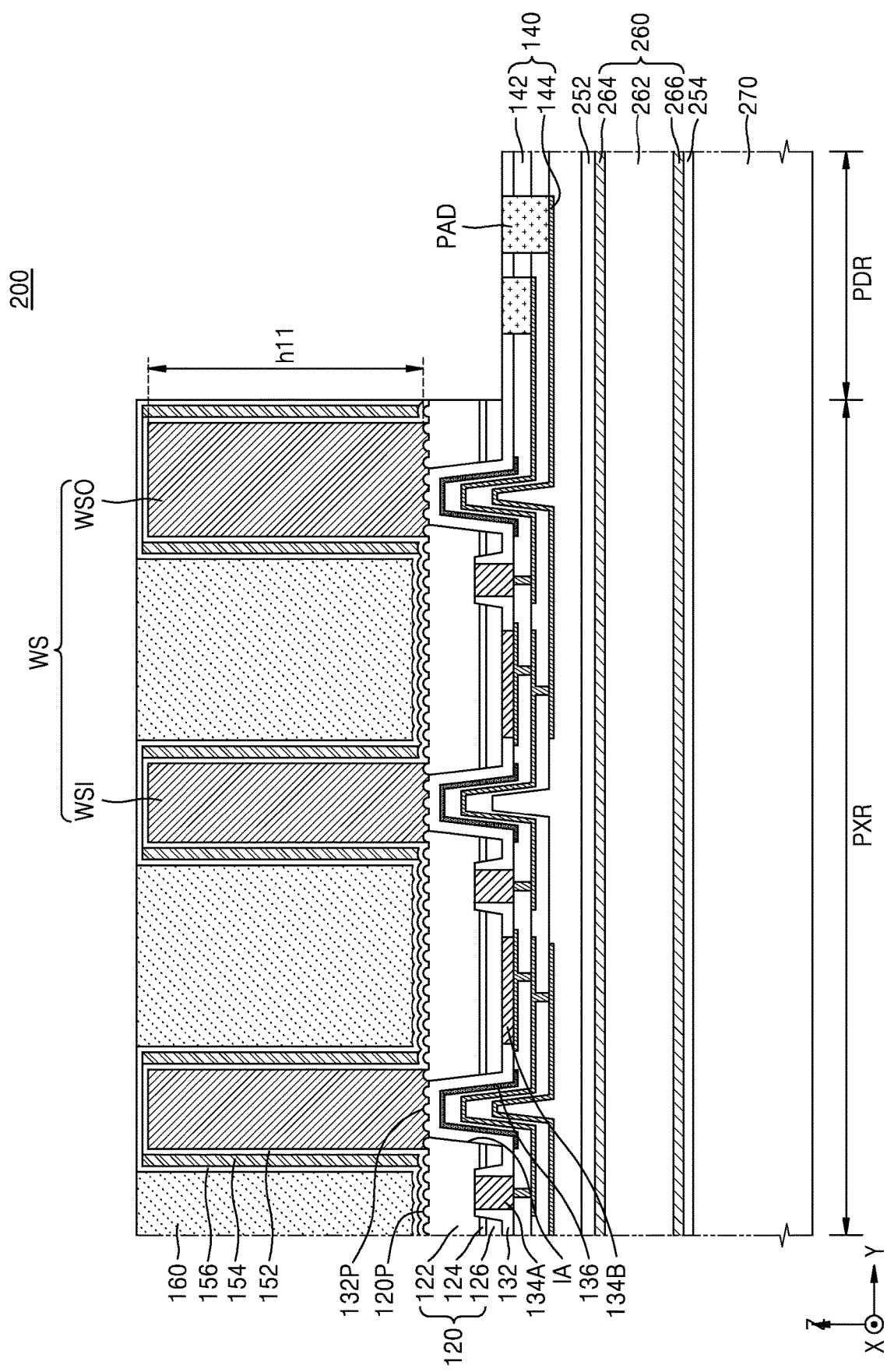
FIG. 10 is a cross-sectional view illustrating a semiconductor light emitting device according to example embodiments.

FIG. 10 is a cross-sectional view illustrating a semiconductor light emitting device 200 according to example embodiments. In FIG. 10, the same reference numerals as in FIGS. 1 to 9 denote the same components.

Referring to FIG. 10, a wiring structure 140 may be disposed on the upper surface of the support structure 260 with the first adhesive layer 252 therebetween, and a printed circuit board 270 may be disposed on the bottom surface of the support structure 260 with the second adhesive layer 254 interposed therebetween. The support structure 260 may include a support substrate 262, a first insulating layer 264, and a second insulating layer 266, and the first insulating layer 264 may contact the first adhesive layer 252, and the second insulating layer 266 may contact the second adhesive layer 254.

The support substrate 262 may include an insulating substrate or a conductive substrate, and may have an electrical resistance of at least several MΩ, for example, an electrical resistance of at least 50 MΩ For example, the support substrate 262 may include doped silicon, undoped silicon, $Al_2O_3$, tungsten (W), copper (Cu), Bismaleimide Triazine (BT) resin, epoxy resin, polyimide, liquid crystal polymer, a copper clad laminate, or a combination thereof. The support substrate 262 may have a thickness of at least about 150 μm in the vertical direction (Z direction), for example, from about 200 μm to about 400 μm.

Each of the first insulating layer 264 and the second insulating layer 266 may have an electrical resistance of at least several tens of MΩ, for example, an electrical resistance of at least 50 MΩ For example, the first insulating layer 264 and the second insulating layer 266 may include at least one of $SiO_2$, $Si_3N_4$, $Al_2O_3$, $HfSiO_4$, $Y_2O_3$, $ZrSiO_4$, $HfO_2$, $ZrO_2$, $Ta_2O_5$, and $La_2O_3$, respectively.

According to example embodiments, because the support structure 260 has a relatively large electrical resistance, it is possible to prevent failure due to unwanted current application from occurring along the vertical direction from the wiring structure 140 to the printed circuit board 270 through the support structure 260.

Figure 11:
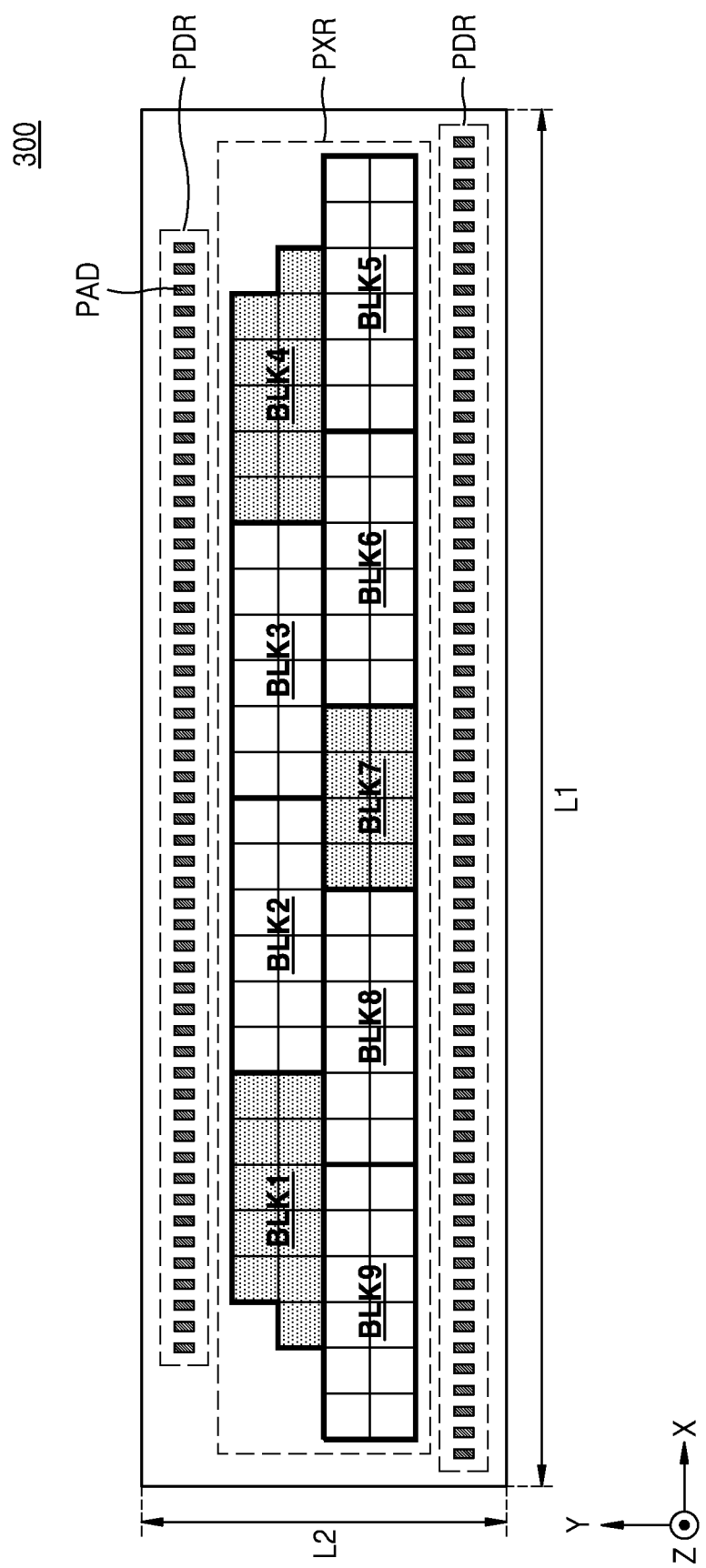
FIG. 11 is a plan view illustrating a semiconductor light emitting device according to example embodiments.

FIG. 11 is a plan view illustrating a semiconductor light emitting device 300 according to example embodiments. In FIG. 11, the same reference numerals as in FIGS. 1 to 10 denote the same components.

Referring to FIG. 11, the semiconductor light emitting device 300 includes a plurality of cell blocks BLK1 to BLK9, and the number of light emitting cells included in at least one of the plurality of cell blocks BLK1 to BLK9 may be different from the number of light emitting cells included in the other cell blocks BLK1 to BLK9. In an example embodiment, the semiconductor light emitting device 300 may include a specific cell block BLK7 disposed at the center of the pixel area PXR which includes a relatively small number of light emitting cells compared to other cell blocks. For example, when the semiconductor light emitting device 300 is included in and used in a light source module for a vehicle headlamp, this light source module needs to irradiate light relatively strongly in the central area in front of the user in the direction the user is traveling, a relatively high current may be applied to the specific cell block BLK7 disposed in the center of the pixel area PXR. As the specific cell block BLK7 disposed in the center of the pixel area PXR includes a relatively small number of light emitting cells, even if a relatively high current is applied to the specific cell block, total power consumption by the specific cell block may be reduced.

In an example embodiment, the semiconductor light emitting device 300 includes specific cell blocks that are disposed at outside portions of the pixel area PXR, and may include specific cell blocks BLK1 and BLK4 including fewer light emitting cells than other cell blocks. In the direction the user is traveling, the need to irradiate light may be low in the upper outer area in front of the user. As specific cell blocks BLK1 and BLK4 disposed at outside portions of the pixel area PXR include relatively fewer light emitting cells than other cell blocks, a light source module including a light emitting device may not separately irradiate light to an unnecessary area.

In an example embodiment, the plurality of cell blocks BLK1 to BLK9 may be arranged in a total of 2 rows (e.g., a first row and a second row), and among the light emitting cells included in the cell blocks disposed in the first row, the light emitting cells disposed adjacent to each other in the Y direction may be driven at the same time (on state) or not (off state). In an example embodiment, the partition wall structure WS may not be formed between light emitting cells disposed adjacent to each other in the Y direction among light emitting cells included in the cell blocks disposed in the first row.

In example embodiments, when viewed from above, the semiconductor light emitting device 300 may have a substantially rectangular shape. In example embodiments, the width L1 in the X direction of the semiconductor light emitting device 300 may be about 1.1 times or more than the width L2 in the Y direction. In example embodiments, the width L1 in the X direction of the semiconductor light emitting device 300 may be less than or equal to about 100 times the width L2 in the Y direction. According to example embodiments, the thickness (i.e., the length in the Z direction) of the semiconductor light emitting device 300 may be tens to several hundred μm, and may be less than about 1/10 of the width L1 in the X direction. The semiconductor light emitting device 300 according to example embodiments may have dimensions in which resistance to physical stress is optimized, and warpage of the semiconductor light emitting device 300 may be minimized.

Figure 12:
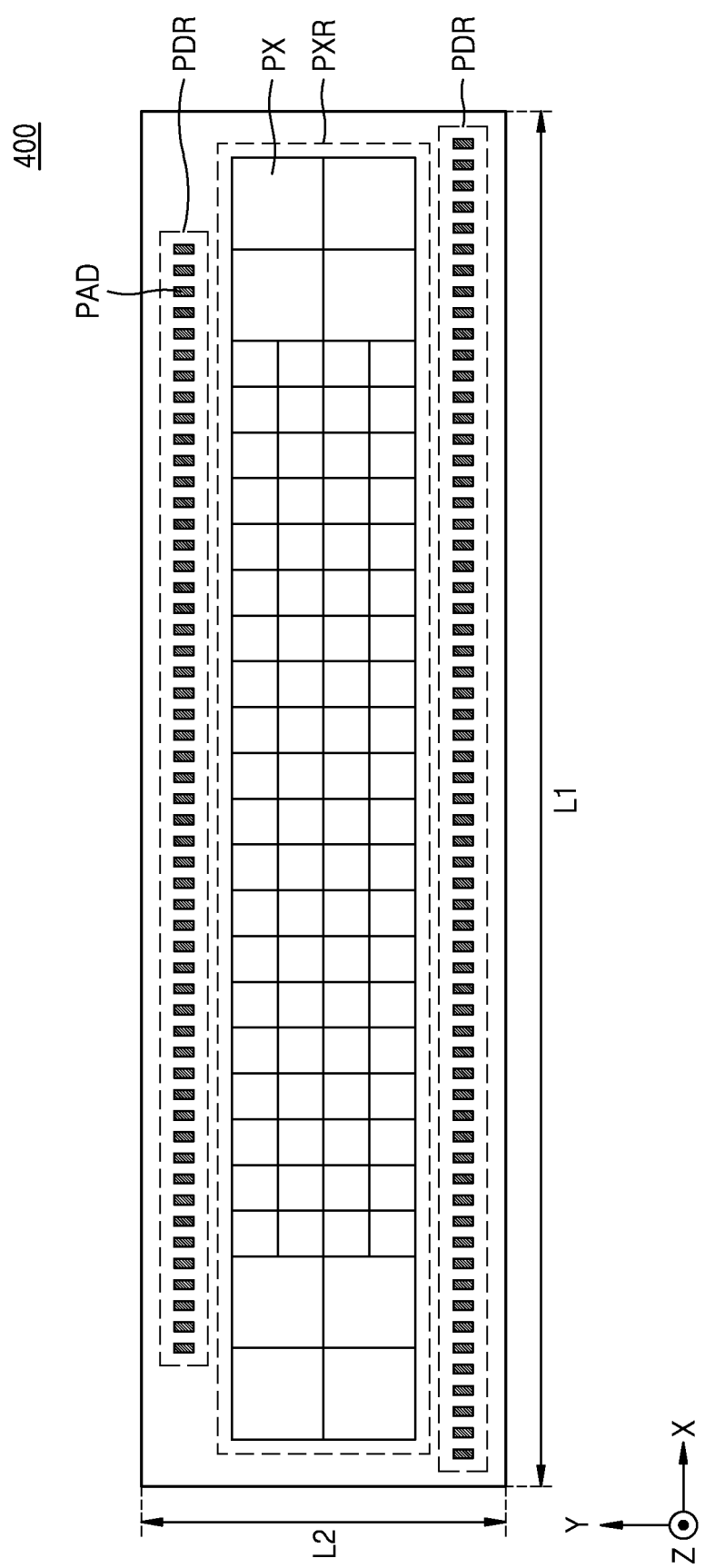
FIG. 12 is a plan view illustrating a semiconductor light emitting device according to example embodiments.

FIG. 12 is a plan view illustrating a semiconductor light emitting device 400 according to example embodiments. In FIG. 12, the same reference numerals as in FIGS. 1 to 11 denote the same components.

Referring to FIG. 12, a size of some of the pixels PX of the semiconductor light emitting device 400 may be different from the size of other pixels PX. For example, when the semiconductor light emitting device 400 is included in a light source module for a vehicle headlamp, because this light source module needs to irradiate light relatively strongly in the central area in front of the user in the direction the user is traveling, the size of the pixel PX arranged in the center of the pixel area PXR may be relatively small, and the size of the pixel PX disposed at the edge (e.g., left edge and right edge) of the pixel area PXR may be relatively large. Accordingly, it is possible to reduce the total power consumption of the semiconductor light emitting device 400.

FIGS. 13 to 24 are cross-sectional views illustrating a method of manufacturing a semiconductor light emitting device 100 according to example embodiments, according to a process sequence. FIGS. 13 to 24 are cross-sectional views corresponding to a cross section taken along line A1-A1' of FIG. 2.

Figure 13:
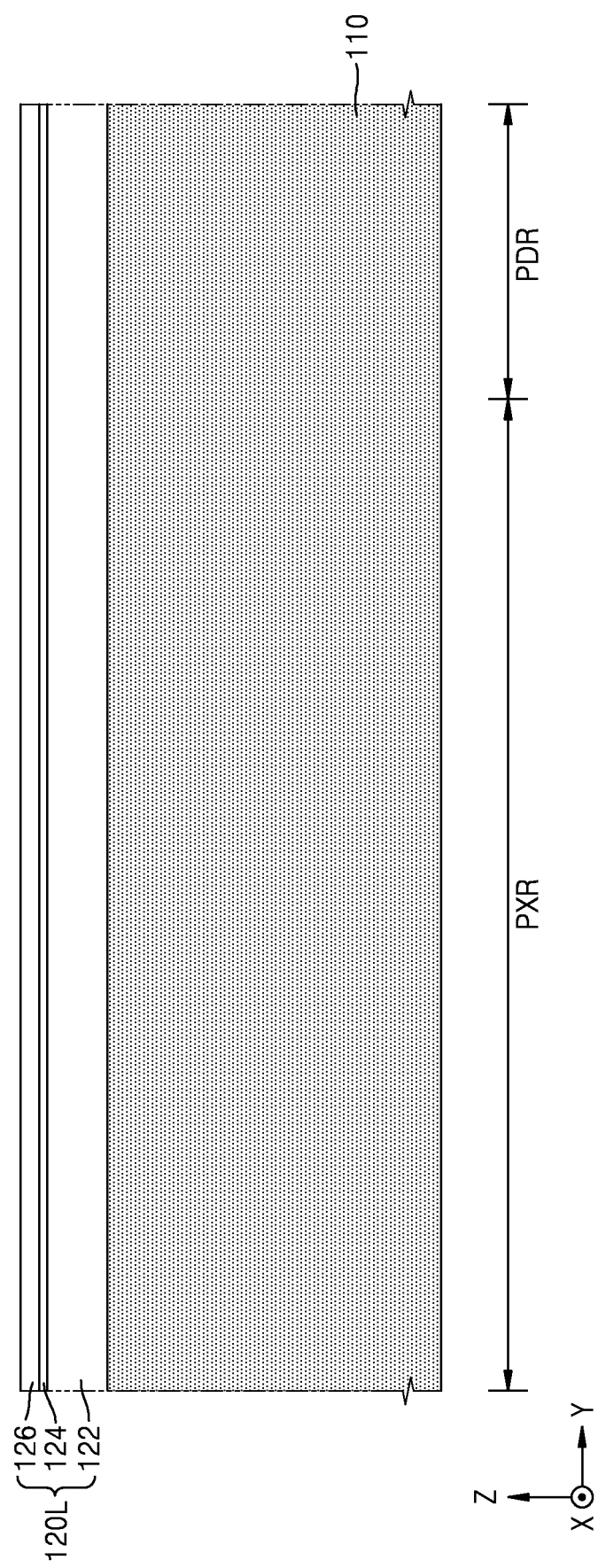
FIGS. 13 to 24 are cross-sectional views illustrating a method of manufacturing a semiconductor light emitting device according to example embodiments, according to a process sequence.

Referring to FIG. 13, a light emitting stack 120L may be formed on the substrate 110.

In example embodiments, the substrate 110 may include a silicon (Si) substrate, a silicon carbide (SiC) substrate, a sapphire substrate, a gallium nitride (GaN) substrate, and the like. The substrate 110 may include a pixel area PXR and a pad area PDR, and in a plan view, the pad area PDR may be disposed on at least one side (e.g., both sides or periphery) of the pixel area PXR.

The light emitting stack 120L may include a first conductivity type semiconductor layer 122, an active layer 124, and a second conductivity type semiconductor layer 126 sequentially formed on the upper surface of the substrate 110. Materials of the first conductivity type semiconductor layer 122, the active layer 124, and the second conductivity type semiconductor layer 126 may be the same as those described above with reference to FIGS. 1 to 5C.

Figure 14:
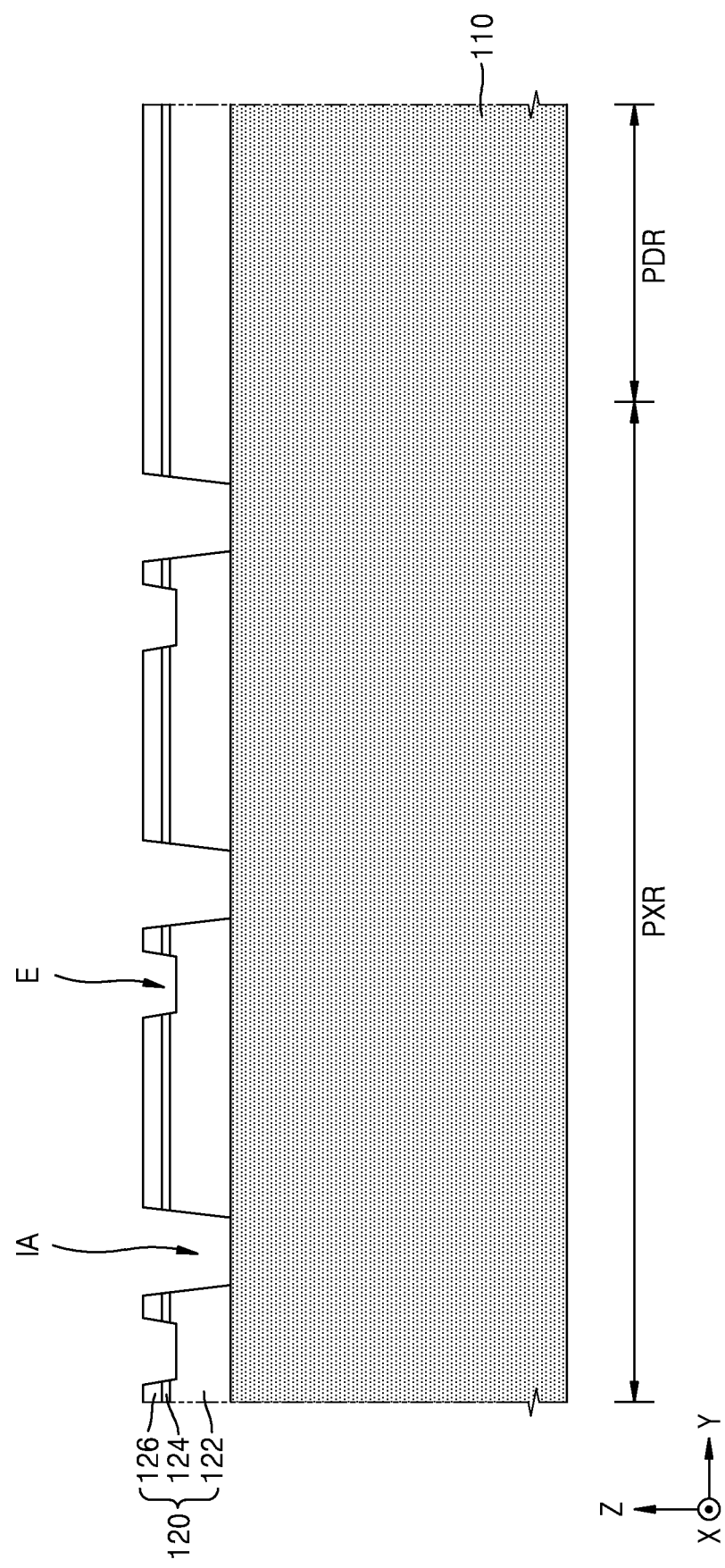

Referring to FIG. 14, a mask pattern is formed on the light emitting stack 120L (see FIG. 13), and the opening portion E may be formed by removing a part of the light emitting stack 120L using the mask pattern as an etching mask. The opening portion E may expose the upper surface of the first conductivity type semiconductor layer 122. The opening portion E may not be formed on the pad area PDR of the substrate 110.

A mask pattern may be formed, and a portion of the light emitting stack 120L may be removed by using the mask pattern as an etching mask to form a device separation area IA. In this case, a plurality of light emitting structures 120 spaced apart by the device separation area IA may be formed.

In example embodiments, the process of forming the device separation area IA may be performed by a blade, but is not limited thereto. As shown in FIG. 14, the shape of the side cross-sectional shape of the plurality of light emitting structures 120 obtained by the process of forming the device separation area IA may be a trapezoidal shape having an upper portion that is wider than that of a lower portion, but example embodiments are not limited thereto. Additionally, in the process of forming the device separation area IA, a portion of the substrate 110 may be removed together to form a recess area in the substrate 110.

Figure 15:
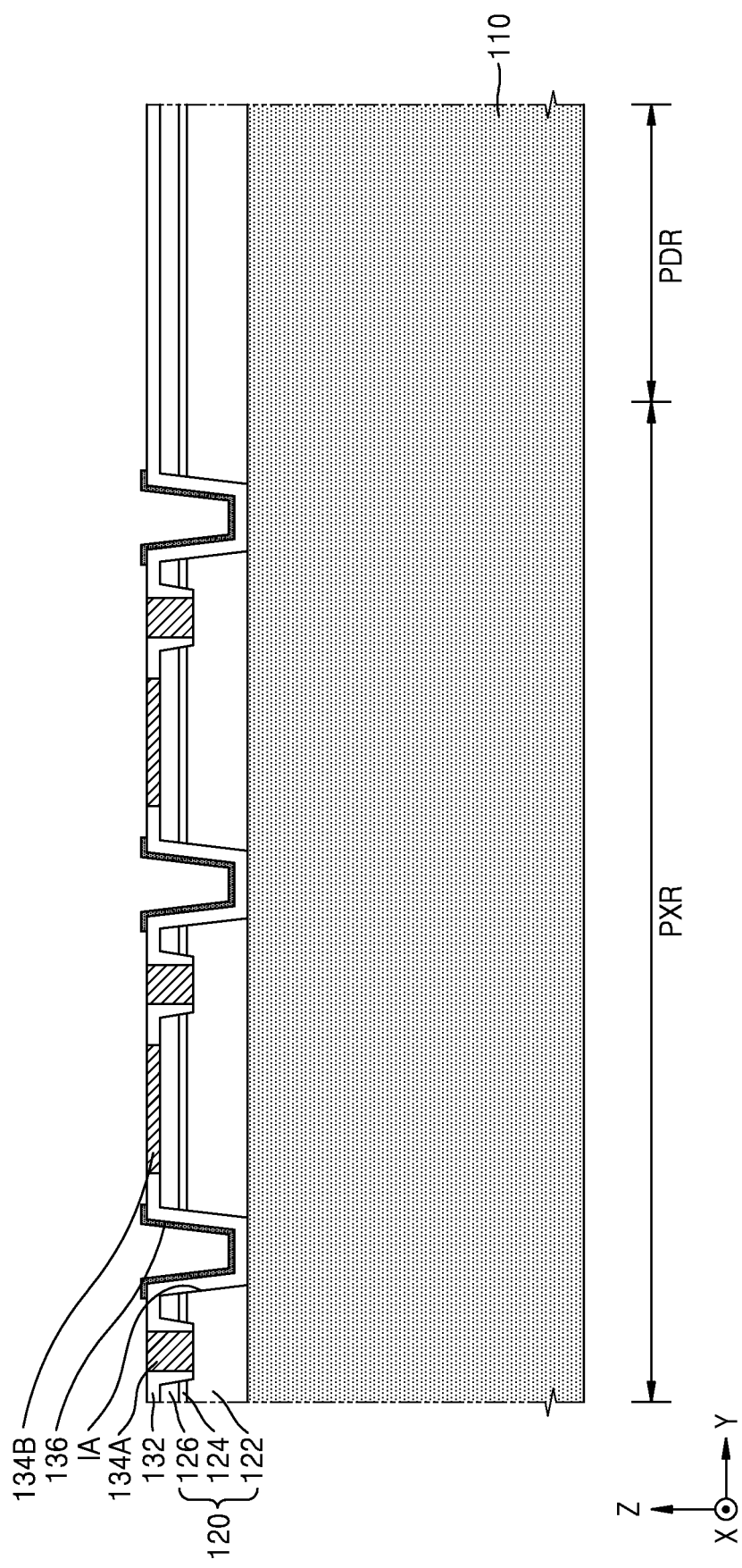

Referring to FIG. 15, a device separation insulating layer 132 may be formed to conformally cover the plurality of light emitting structures 120. A portion of the device separation insulating layer 132 is removed to expose the upper surface of the second conductivity type semiconductor layer 126, and form second contacts 134B on the exposed upper surface of the second conductivity type semiconductor layer 126, respectively. The second contact 134B may be formed using Ag, Al, Ni, Cr, Au, Pt, Pd, Sn, W, Rh, Ir, Ru, Mg, Zn, Ti, Cu, and combinations thereof. In some example embodiments, an ohmic metal layer formed of a conductive ohmic material may be further formed on the upper surface of the second conductivity type semiconductor layer 126, and the second contact 134B may be formed on the ohmic metal layer.

A part of the device separation insulating layer 132 is removed from the opening portion E to expose the upper surface of the first conductivity type semiconductor layer 122, and form first contacts 134A on the exposed upper surface of the first conductivity type semiconductor layer 122, respectively. The first contact 134A may be formed using Ag, Al, Ni, Cr, Au, Pt, Pd, Sn, W, Rh, Ir, Ru, Mg, Zn, Ti, Cu, and combinations thereof. In some example embodiments, an ohmic metal layer formed of a conductive ohmic material may be further formed on the upper surface of the first conductivity type semiconductor layer 122, and the first contact 134A may be formed on the ohmic metal layer.

A lower reflector layer 136 may be formed on the device separation insulating layer 132 along the inner wall of the device separation area IA. In other example embodiments, the lower reflector layer 136 may be formed simultaneously in the process of forming the first contact 134A or may be formed simultaneously in the process of forming the second contact 134B.

Figure 16:
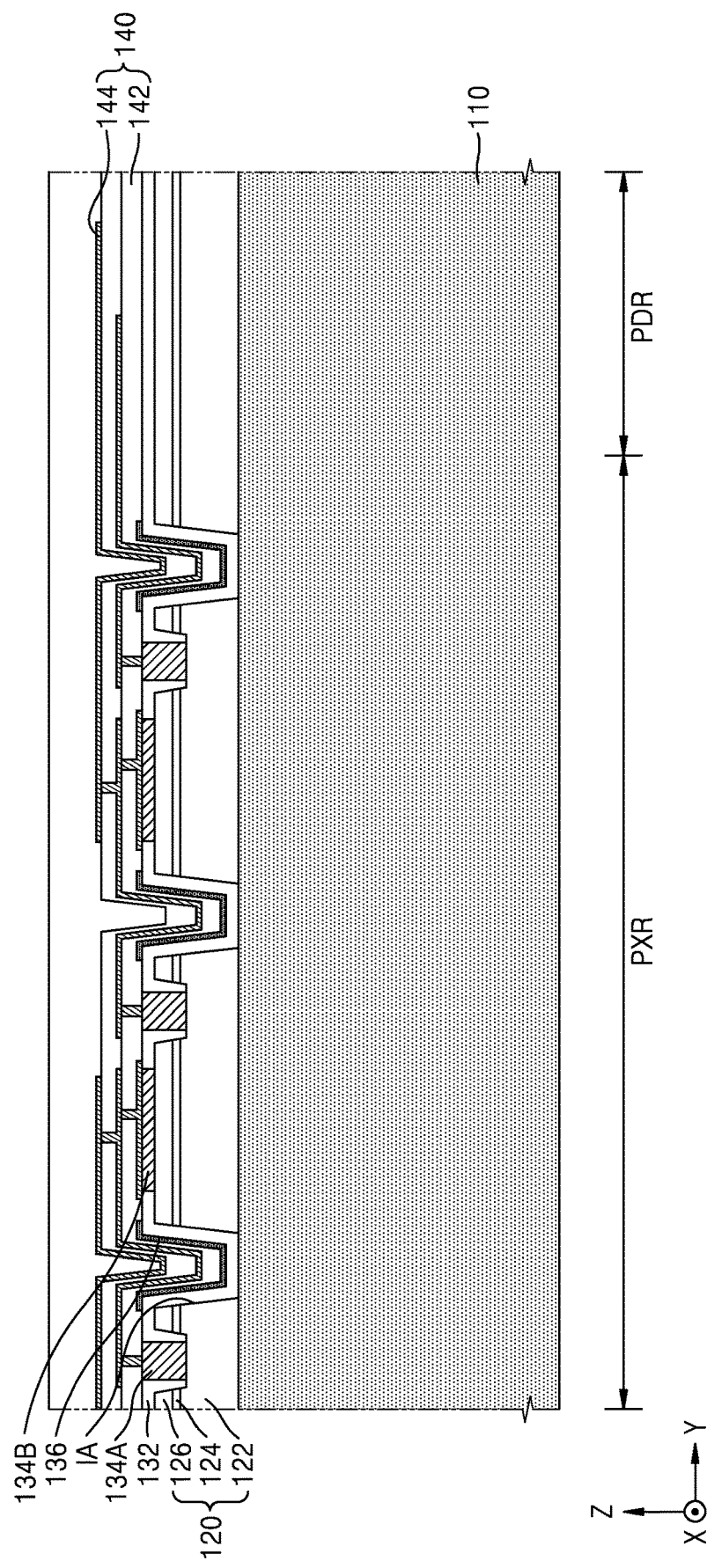

Referring to FIG. 16, a wiring structure 140 may be formed on the device separation insulating layer 132, the first contact 134A, the second contact 134B, and the lower reflector layer 136. For example, By repeating the process of forming a conductive layer on the device separation insulating layer 132, the first contact 134A, the second contact 134B, and the lower reflector layer 136, patterning the conductive layer to form a wiring layer 144, and forming the insulating layer 142 covering the wiring layer 144, a wiring structure 140 composed of a plurality of wiring layers 144 and a plurality of insulating layers 142 may be formed. In example embodiments, at least a portion of the plurality of wiring layers 144 may be formed by a plating process.

Figure 17:
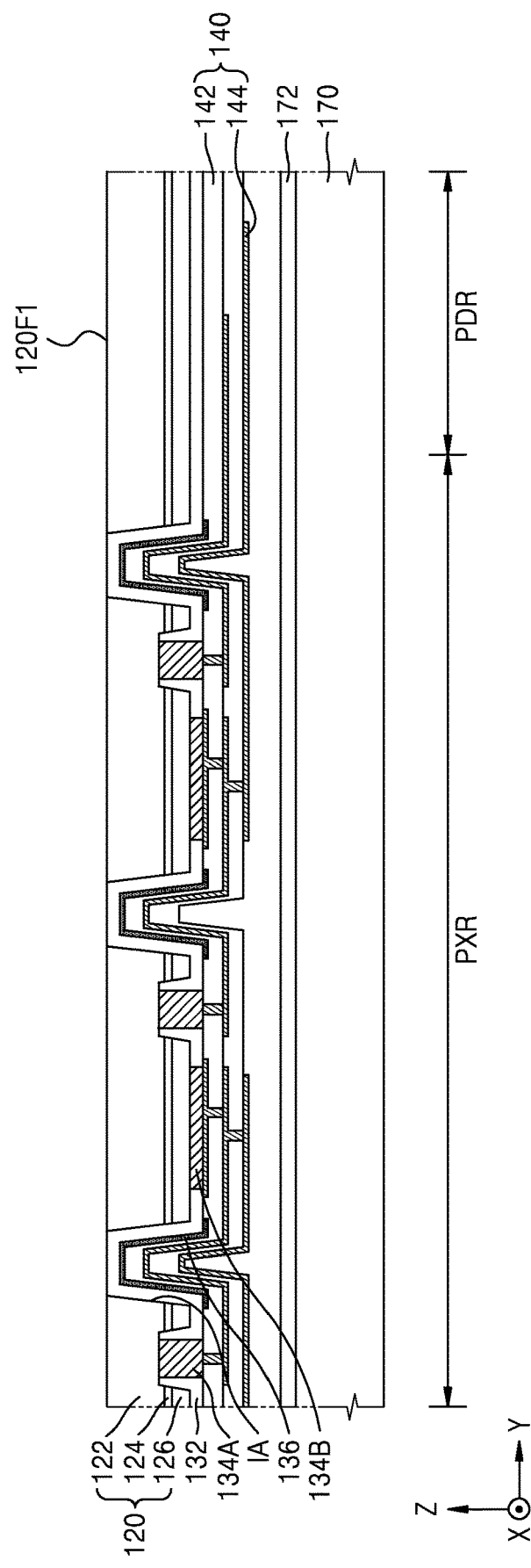

Referring to FIG. 17, an adhesive layer 172 may be formed on the wiring structure 140, and a support substrate 170 may be attached to the adhesive layer 172. The support substrate 170 and the attached light emitting structure 120 may be turned over so that the surface opposite to the surface in contact with the light emitting structure 120 of the substrate 110 faces upward.

The substrate 110 may be removed by a grinding process or a laser lift-off process. In example embodiments, when the substrate 110 is a silicon or silicon carbide substrate, the entire thickness of the substrate 110 may be removed by a grinding process. In other example embodiments, when the substrate 110 is a sapphire substrate, the substrate 110 may be separated or detached from the support substrate 170 and the light emitting structure 120 attached thereto by a laser lift-off process.

As shown in FIG. 17, the first surface 120F1 of the plurality of light emitting structures 120 and the upper surface of the device separation insulating layer 132 may be exposed, and the first surface 120F1 of the plurality of light emitting structures 120 and the upper surface of the device separation insulating layer 132 may have a flat upper surface level.

Figure 18:
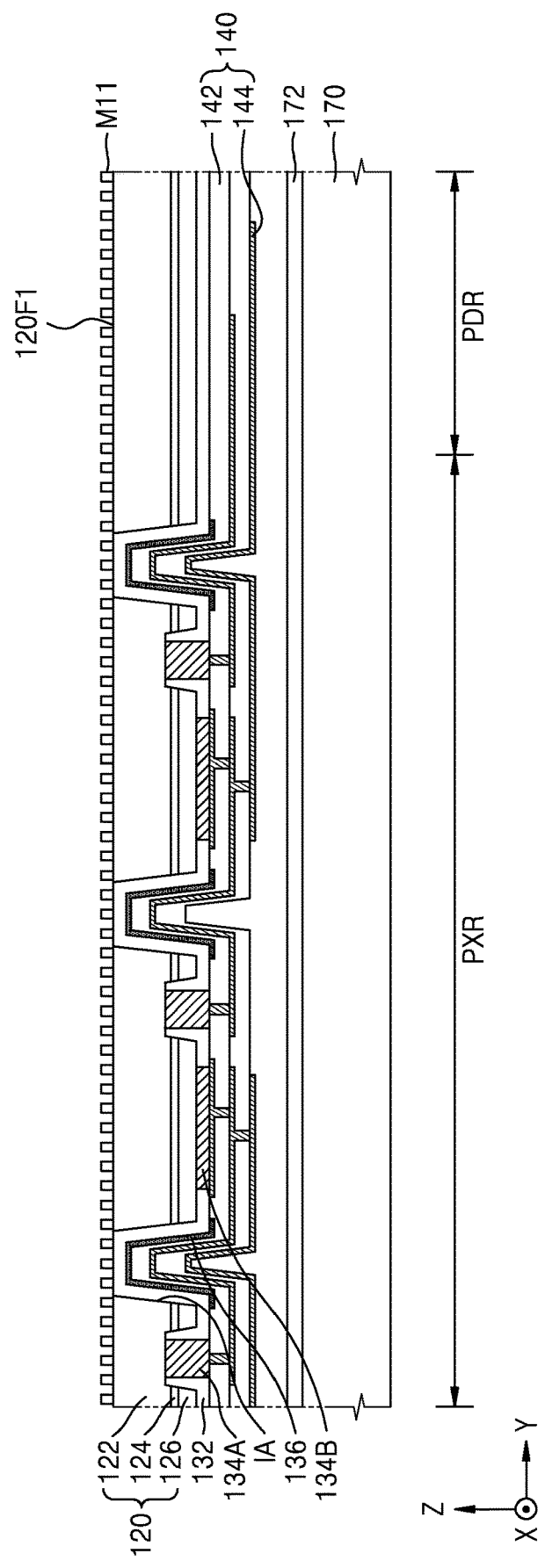

Referring to FIG. 18, a mask pattern M11 may be formed on the first surface 120F1 of the plurality of light emitting structures 120 and the upper surface of the device separation insulating layer 132.

In example embodiments, the mask pattern M11 may have a plurality of island shapes spaced apart from each other at a predetermined interval. In other example embodiments, the mask pattern M11 may have a shape including a plurality of holes spaced at a predetermined interval.

In the process of forming the mask pattern M11, because the first surface 120F1 of the plurality of light emitting structures 120 under the mask pattern M11 and the upper surface of the device separation insulating layer 132 form a flat surface with no height difference or step difference, defects occurring in a process of forming the mask pattern M11 may be prevented.

Figure 19:
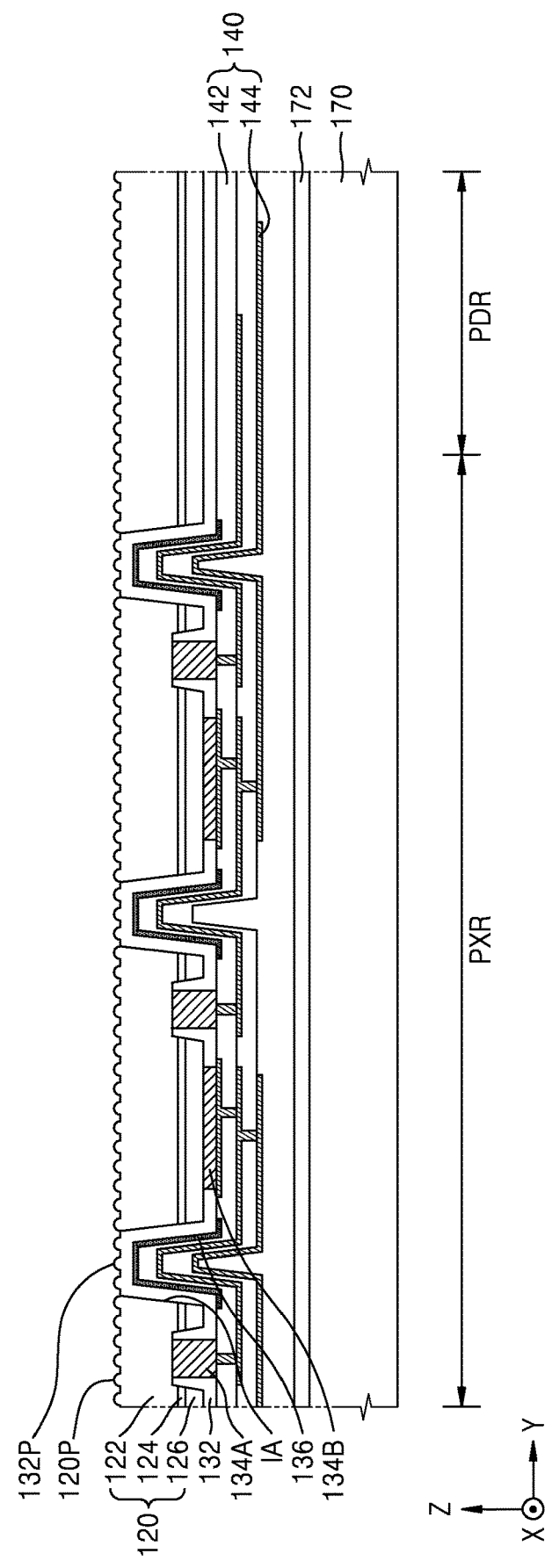

Referring to FIG. 19, by using the mask pattern M11 as an etching mask to remove a part of the light emitting structure 120 and a part of the device separation insulating layer 132 through a dry texturing process, a plurality of embossed portions 120P and a plurality of protrusion portions 132P may be formed. The plurality of embossed portions 120P may be formed on the light emitting structure 120 and the plurality of protrusion portions 132P may be formed on the device separation insulating layer 132. For example, the dry texturing process may be a dry etching process for transferring the shape of the mask pattern M11 to the plurality of embossed portions 120P and the plurality of protrusion portions 132P.

The shapes and layouts of the plurality of embossed portions 120P formed by the dry texturing process may refer to those shown in FIGS. 5A to 5C. However, the shape and layout of the plurality of embossed portions 120P may vary according to the shape or layout of the mask pattern M11. For example, the plurality of embossed portions 120P may be arranged in a matrix structure instead of arranged in a hexagonal structure.

Figure 20:
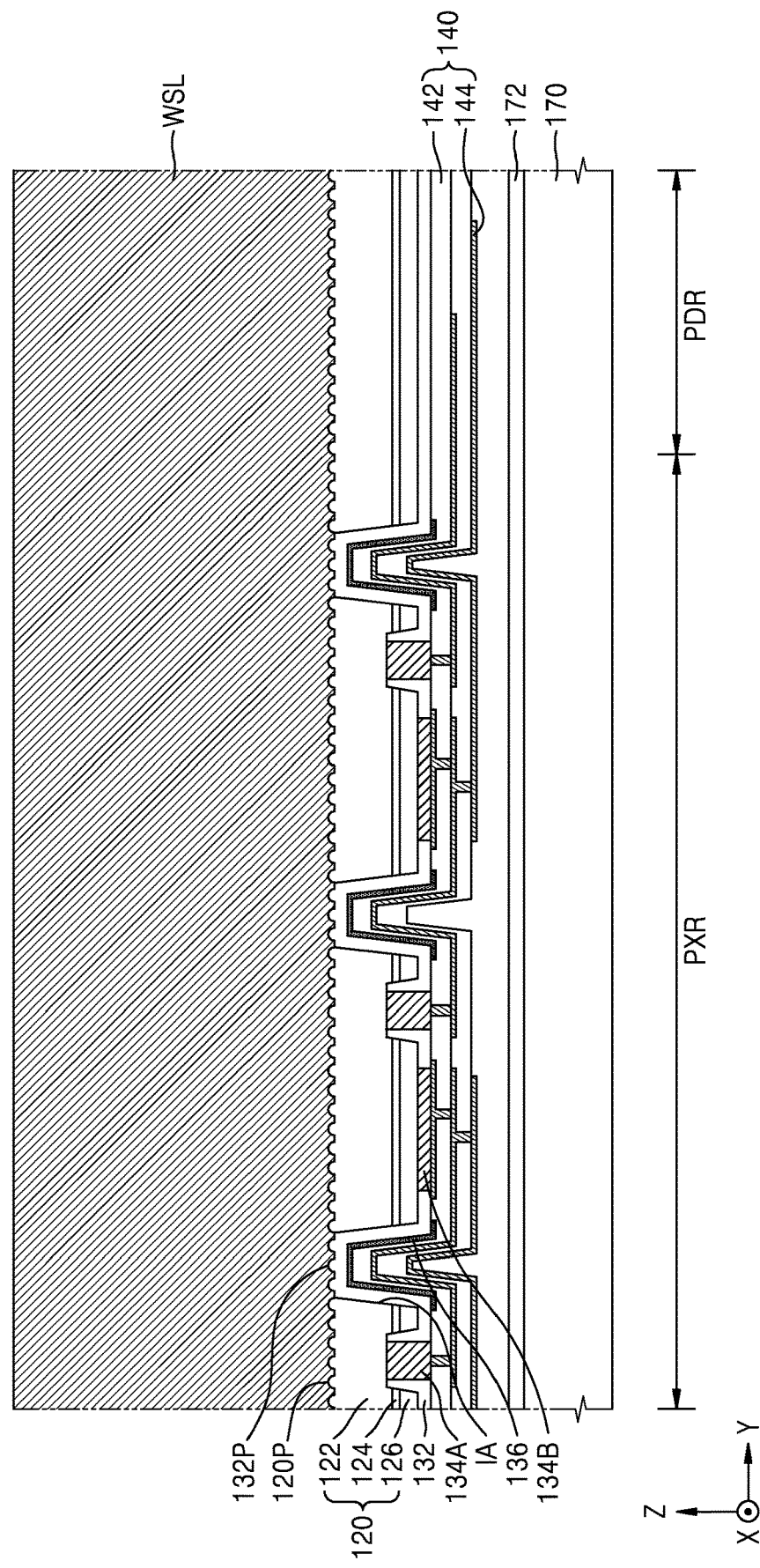

Referring to FIG. 20, a preliminary partition wall layer WSL may be formed on the first surface 120F1 of the light emitting structure 120 and the upper surface of the device separation insulating layer 132.

In example embodiments, the preliminary partition wall layer WSL may include a negative type photosensitive material or a positive type photosensitive material. In some example embodiments, the preliminary partition wall layer WSL may include a photosensitive epoxy resin. In some example embodiments, the preliminary partition wall layer WSL may be provided in a film type and may be attached on the first surface 120F1 of the light emitting structure 120 and the upper surface of the device separation insulating layer 132. In other example embodiments, the preliminary partition wall layer WSL may be provided in a liquid type and may be formed to a predetermined thickness by spin coating or the like on the first surface 120F1 of the light emitting structure 120 and the upper surface of the device separation insulating layer 132.

As the preliminary partition wall layer WSL is provided in a film type or a liquid type and is formed to cover the entire upper surface of the plurality of embossed portions 120P, the plurality of protrusion portions WSP (refer to FIG. 4) may be formed in the bottom portion of the preliminary partition wall layer WSL, conforming to the shape of the plurality of embossed portions 120P of the light emitting structure 120.

Figure 21:
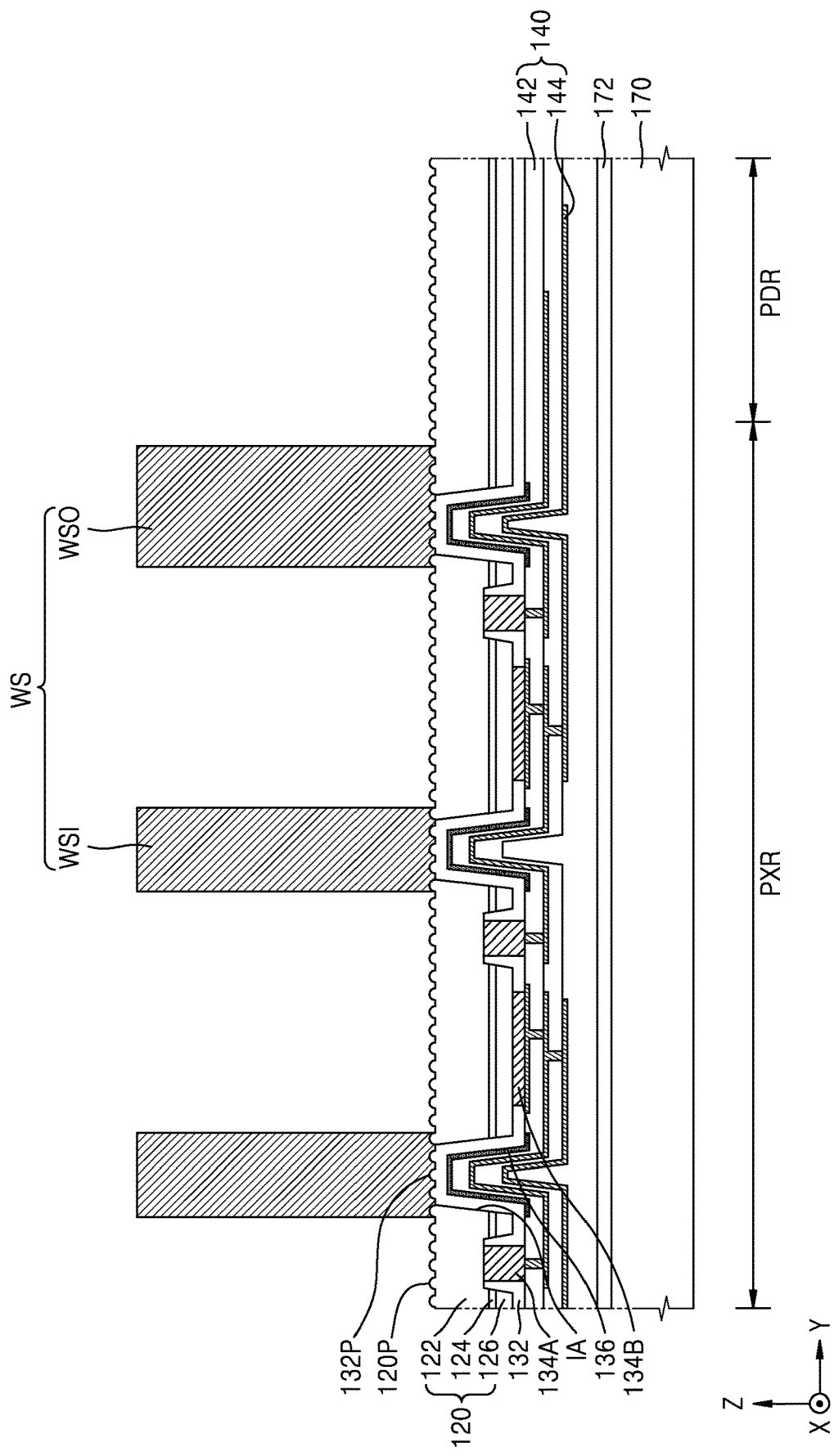

Referring to FIG. 21, the partition wall structure WS may be formed by performing exposure and development processes on the preliminary partition wall layer WSL. For example, when the preliminary partition wall layer WSL includes a photosensitive epoxy resin, for example, an exposure process using light in the UV area in the range of about 350 nm to about 450 nm may be used.

The partition wall structure WS may have a structure including a plurality of partition walls WSI defining a plurality of pixel spaces PXS and a peripheral partition wall WSO. The plurality of partition walls WSI may be arranged to vertically overlap the device separation area IA, and the plurality of light emitting structures 120 may be disposed in each of the plurality of pixel spaces PXS. The plurality of embossed portions 120P may be exposed to a bottom portion of each of the plurality of pixel spaces PXS.

In other example embodiments, the preliminary partition wall layer WSL may not include a photosensitive material. In this case, an additional mask pattern may be formed on the preliminary partition wall layer WSL, and the partition wall structure WS may be formed by removing some areas of the preliminary partition wall layer WSL using the mask pattern as an etching mask.

Figure 22:
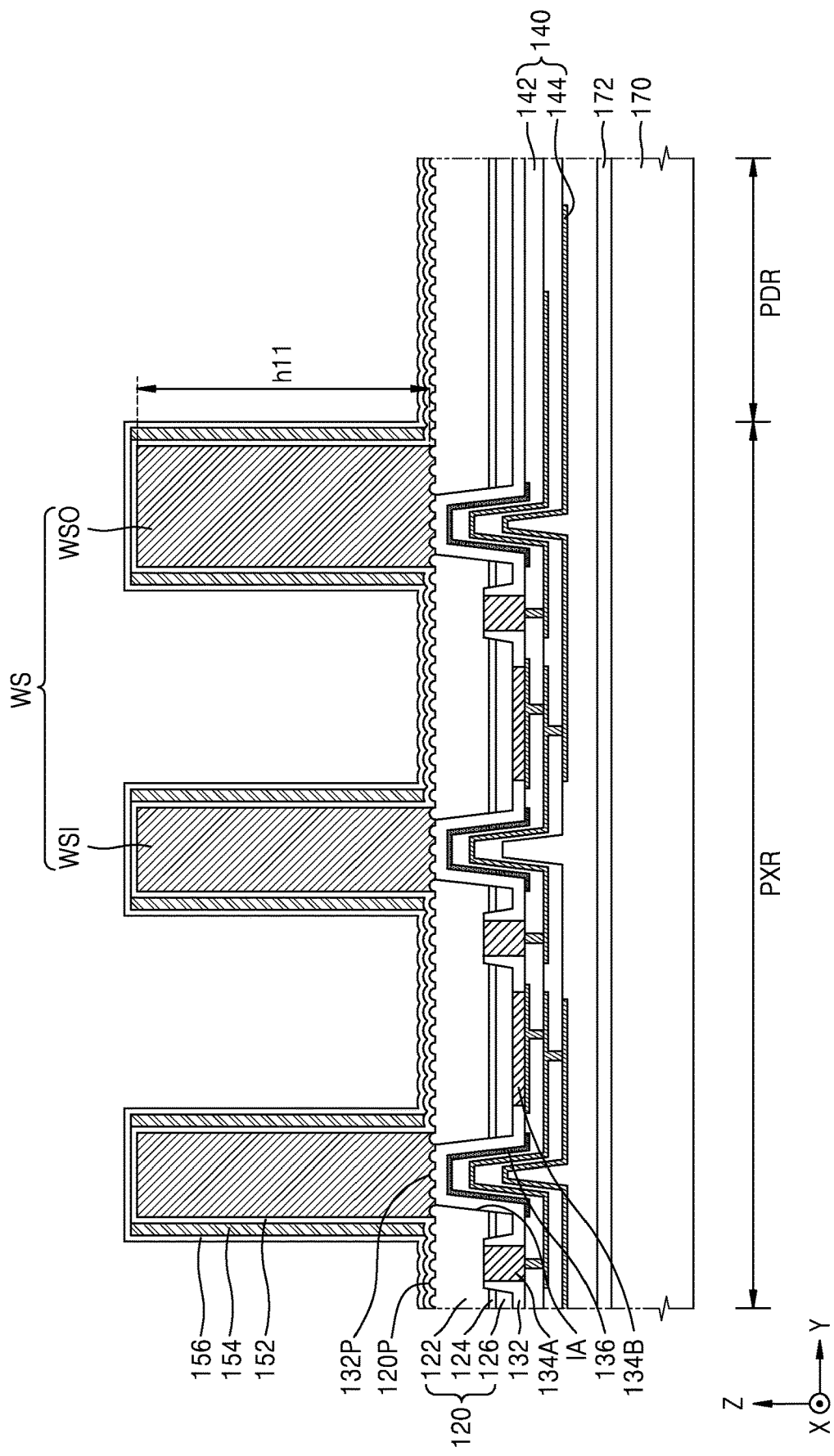

Referring to FIG. 22, the plurality of partition walls WSI and the peripheral partition wall WSO may have the first height h11. A first insulating layer 152 may be formed on the plurality of partition walls WSI and the light emitting structures 120. The first insulating layer 152 may be formed on upper surfaces and sidewalls of the plurality of partition walls WSI and on the upper surfaces of the plurality of light emitting structures 120. The first insulating layer 152 disposed in the bottom portion of the plurality of pixel spaces PXS may be conformally disposed to cover the plurality of embossed portions 120P.

In example embodiments, the first insulating layer 152 may be formed using a first insulating material that includes any one or any combination of silicon oxide, silicon nitride, silicon oxynitride, aluminum oxide, and aluminum nitride. The first insulating layer 152 may be formed using an atomic layer deposition (ALD) process, a chemical vapor deposition (CVD) process, or the like.

A sidewall reflector layer 154 may be formed on the sidewalls of the plurality of partition walls WSI. For example, the sidewall reflector layer 154 may be a metal layer including Ag, Al, Ni, Cr, Au, Pt, Pd, Sn, W, Rh, Ir, Ru, Mg, Zn, and combinations thereof. In example embodiments, a metal layer covering the partition wall structure WS is formed on the first insulating layer 152 and by performing an anisotropic etching process on the metal layer, the sidewall reflector layer 154 may be left on the sidewalls of the plurality of partition walls WSI.

A second insulating layer 156 covering the partition wall structure WS may be formed on the sidewall reflector layer 154 and the first insulating layer 152. The second insulating layer 156 disposed in the bottom portion of the plurality of pixel spaces PXS may be conformally disposed to cover the plurality of embossed portions 120P.

Figure 23:
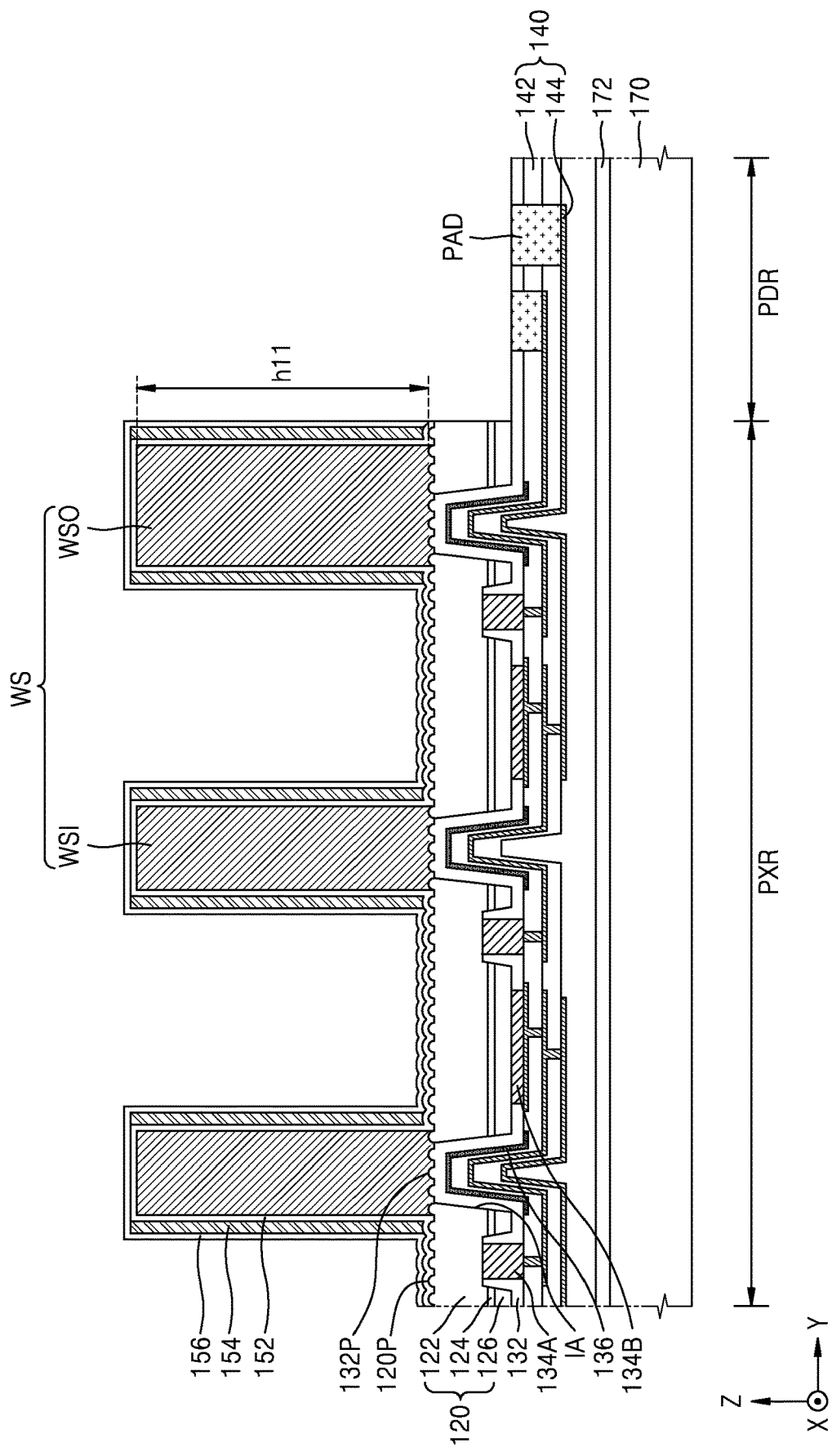

Referring to FIG. 23, the wiring structure 140 may be exposed by removing the light emitting structure 120 exposed outside the peripheral partition wall WSO. An opening portion may be formed in the wiring structure 140 and a pad portion PAD may be formed by filling a conductive material in the opening portion.

Figure 24:
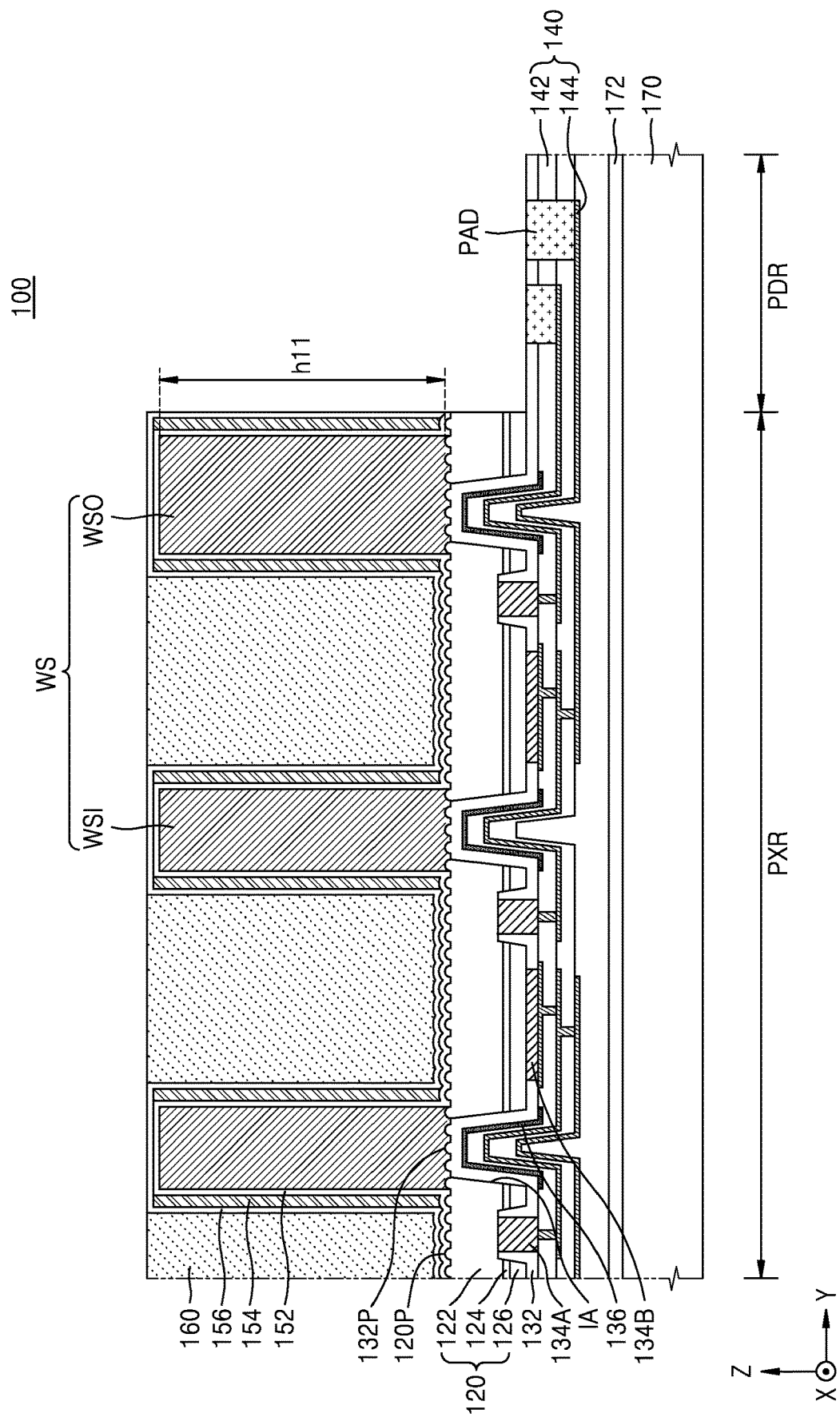

Referring to FIG. 24, a fluorescent layer 160 filling the inside of a plurality of pixel spaces PXS may be formed. In example embodiments, the fluorescent layer 160 may be formed by applying or dispensing a resin in which phosphor particles are dispersed in a plurality of pixel spaces PXS.

By the above-described process, the semiconductor light emitting device 100 may be completed.

In general, a method of forming a partition wall structure by patterning a growth substrate such as silicon has been proposed. In this method, a growth substrate having a relatively high thickness is patterned to form a pixel space, and in order to improve light extraction, an uneven portion is formed on the first surface of the light emitting structure exposed to the bottom portion of the pixel space by a wet etching process. In particular, because the height of the partition wall structure is relatively large, a relatively large step difference (or a level difference) occurs between the first surface of the light emitting structure and the upper surface of the partition wall structure, and therefore, it is almost impossible to form an uneven portion by a dry texturing process using a mask pattern. Instead of using the dry texturing process, a wet etching process is used to form an uneven portion on the first surface of the light emitting structure exposed to the bottom portion of the pixel space, and accordingly, there is a problem in that it is difficult to control the shape and depth of the uneven portion, and there is a limitation in improving light extraction of the light emitting structure.

However, according to example embodiments, after removing all the growth substrates and exposing the flat upper surface of the light emitting structure 120, a plurality of embossed portions 120P having a precisely controlled size and shape may be formed on the upper surface by dry texturing using the mask pattern M11. Accordingly, light extraction efficiency from the light emitting structure 120 may be improved, and the semiconductor light emitting device 100 may have excellent light emission quality.

Figure 25:
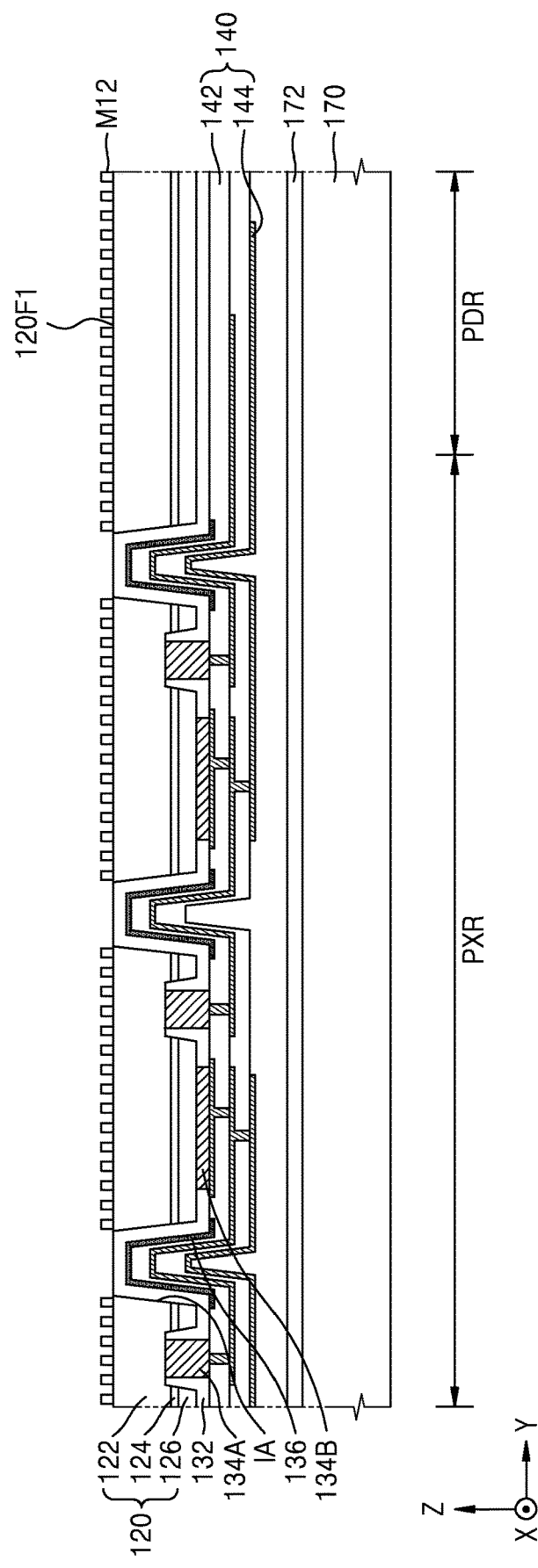
FIGS. 25 and 26 are cross-sectional views illustrating a method of manufacturing a semiconductor light emitting device according to example embodiments, according to a process sequence.
Figure 26:
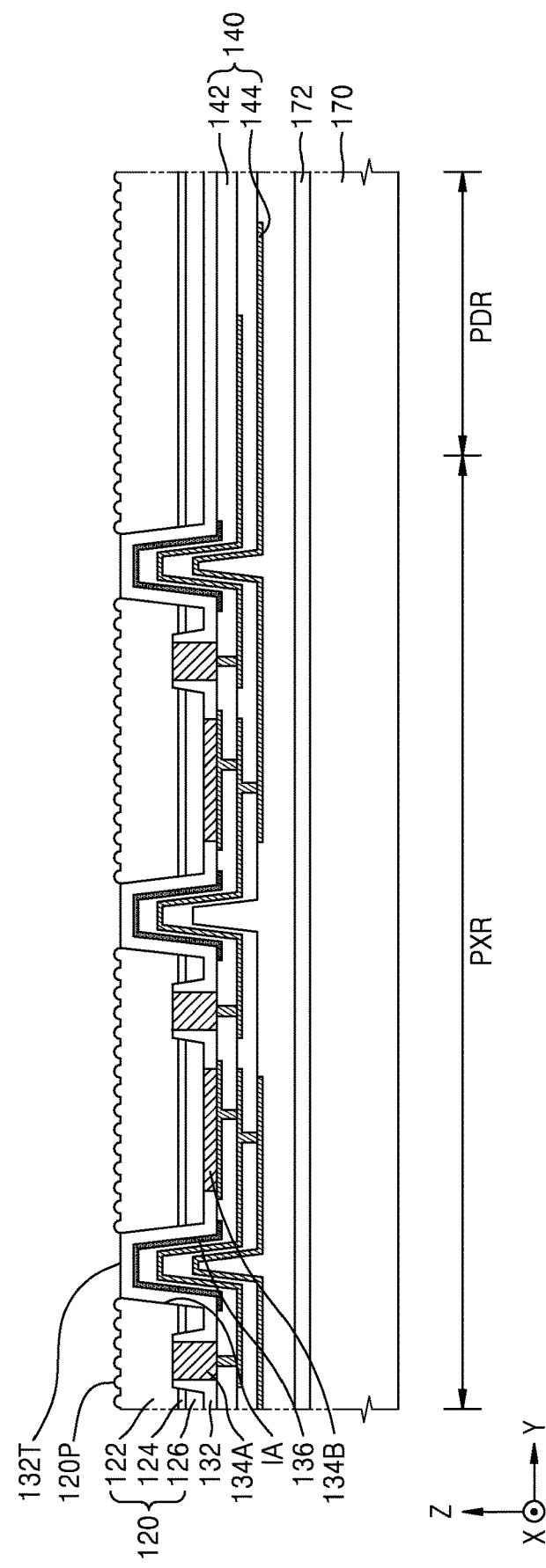

FIGS. 25 and 26 are cross-sectional views illustrating a method of manufacturing a semiconductor light emitting device 100A according to example embodiments, according to a process sequence.

First, a structure in which the plurality of light emitting structures 120 are removed from the substrate 110 is formed by performing the process described with reference to FIGS. 13 to 17.

Referring to FIG. 25, a mask pattern M12 may be formed on the first surface 120F1 of the plurality of light emitting structures 120 and the upper surface of the device separation insulating layer 132.

In example embodiments, the mask pattern M12 may have a plurality of island shapes spaced at a predetermined interval, and the upper surface of the device separation insulating layer 132 may not be covered by the mask pattern M12. In other example embodiments, the mask pattern M11 may have a shape including a plurality of holes spaced at a predetermined interval, and the upper surface of the device separation insulating layer 132 may not be covered by the mask pattern M12.

In the process of forming the mask pattern M12, because the first surface 120F1 of the plurality of light emitting structures 120 under the mask pattern M12 and the upper surface of the device separation insulating layer 132 form a flat surface with no height difference or step difference, defects occurring in a process of forming the mask pattern M12 may be prevented.

Referring to FIG. 26, a plurality of embossed portions 120P may be formed by removing a part of the light emitting structure 120 through a dry texturing process using the mask pattern M12 as an etching mask. For example, the dry texturing process may be a dry etching process for transferring the shape of the mask pattern M11 to the plurality of embossed portions 120P and the plurality of protrusion portions 132P.

In example embodiments, as the upper surface of the device separation insulating layer 132 is not covered by the mask pattern M12, in the dry texturing process, the device separation insulating layer 132 may be removed by a relatively uniform thickness, and the device separation insulating layer 132 may be formed to have a flat upper surface 132T. In example embodiments, the etching amount of the device separation insulating layer 132 may be smaller than the etching amount of the light emitting structure 120 removed in the dry texturing process, and the device separation insulating layer 132 may be formed to have a flat upper surface 132T.

In other example embodiments, the mask pattern M12 may cover the entire upper surface of the device separation insulating layer 132. In this case, the device separation insulating layer 132 is not removed in the dry texturing process, and thus, the device separation insulating layer 132 may be formed to have a flat upper surface 132T.

The process described with reference to FIGS. 20 to 24 may be performed to complete the semiconductor light emitting device 100A.

Figure 27:
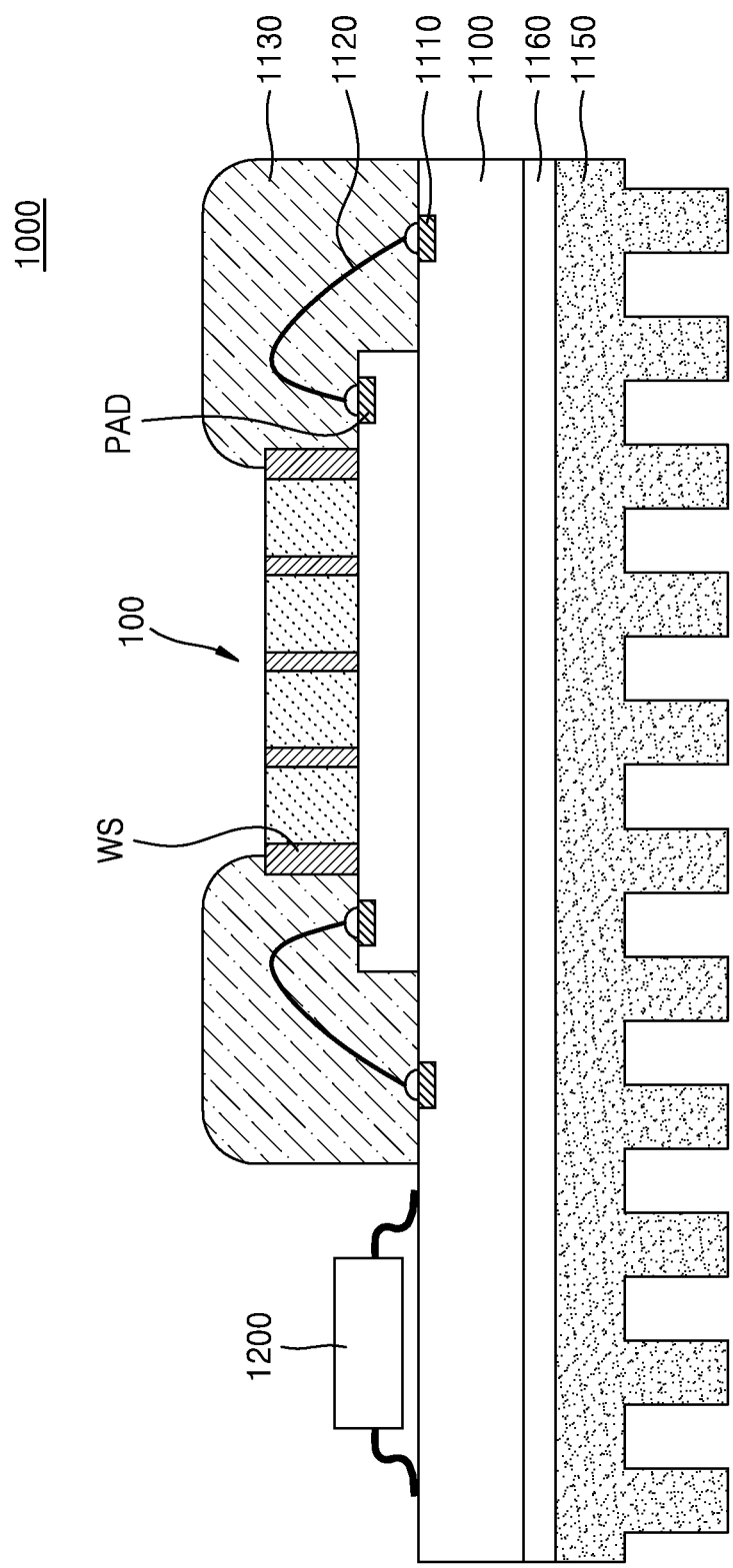
FIG. 27 is a cross-sectional view illustrating a light source module including a semiconductor light emitting device according to example embodiments.

FIG. 27 is a cross-sectional view illustrating a light source module 1000 including a semiconductor light emitting device according to example embodiments. In FIG. 27, the same reference numerals as in FIGS. 1 to 26 denote the same components.

Referring to FIG. 27, the light source module 1000 may include a semiconductor light emitting device 100 and a driving semiconductor chip 1200 mounted on a printed circuit board 1100.

The printed circuit board 1100 may include an inner conductive pattern layer, and may include a pad 1110 electrically connected to the inner conductive pattern layer. The semiconductor light emitting device 100 is mounted on the printed circuit board 1100, and the pad portion PAD of the semiconductor light emitting device 100 may be connected to the pad 1110 of the printed circuit board 1100 through a bonding wire 1120. The one or more driving semiconductor chips 1200 may be configured to individually or entirely drive the plurality of light emitting structures 120 of the semiconductor light emitting device 100.

A molding material 1130 surrounding an edge area of the semiconductor light emitting device 100 may be further disposed on the printed circuit board 1100. The molding material 1130 may be disposed to surround the outermost portion of the partition wall structure WS of the semiconductor light emitting device 100 and cover the pad portion PAD and the bonding wire 1120.

A heat sink 1150 is attached to the bottom surface of the printed circuit board 1100, and optionally, a thermal interface material (TIM) layer 1160 may be further interposed between the heat sink 1150 and the printed circuit board 1100.

In addition to the semiconductor light emitting device 100 described with reference to FIGS. 1 to 5C, the semiconductor light emitting devices 100A, 100B, 100C, 200, 300, and 400 described with reference to FIGS. 6 to 12 may be mounted alone or in combination on the light source module 1000.

Figure 28:
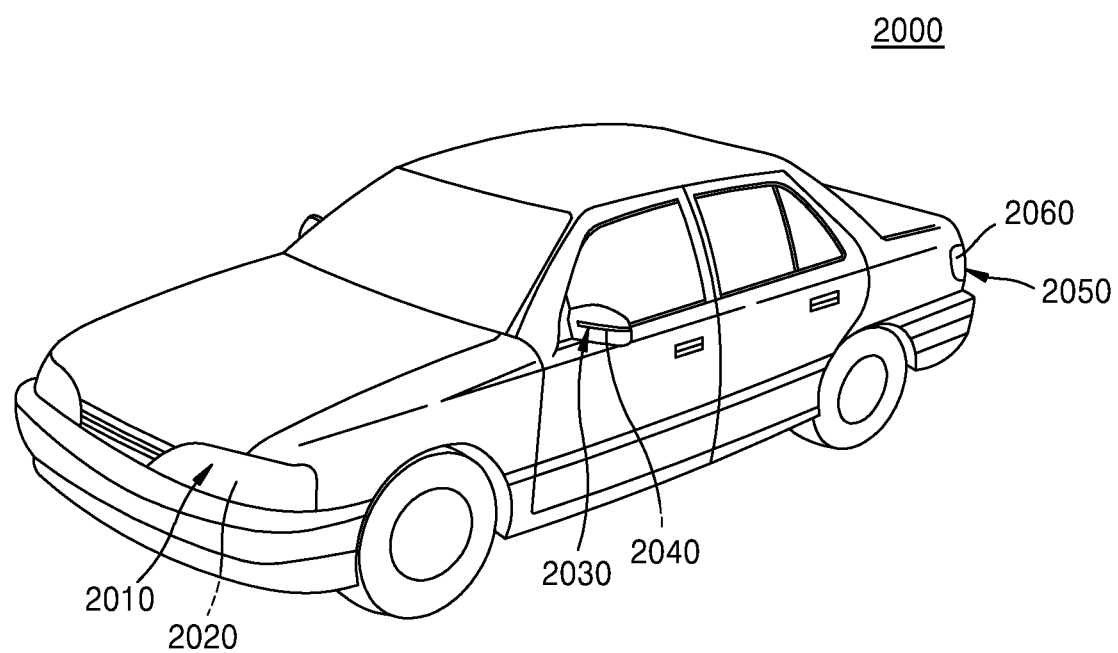
FIG. 28 is a schematic perspective view of a lighting device including a semiconductor light emitting device according to example embodiments.

FIG. 28 is a schematic perspective view of a lighting device including a semiconductor light emitting device according to example embodiments.

Referring to FIG. 28, a headlamp module 2020 may be installed in a headlamp portion 2010 of a vehicle, and a side mirror lamp module 2040 may be installed in an external side mirror unit 2030, and a tail lamp module 2060 may be installed in the tail lamp unit 2050. At least one of the headlamp module 2020, the side mirror lamp module 2040, and the tail lamp module 2060 may be a light source module including at least one of the semiconductor light emitting devices 100, 100A, 100B, 100C, 200, 300, and 400 described above.

Figure 29:
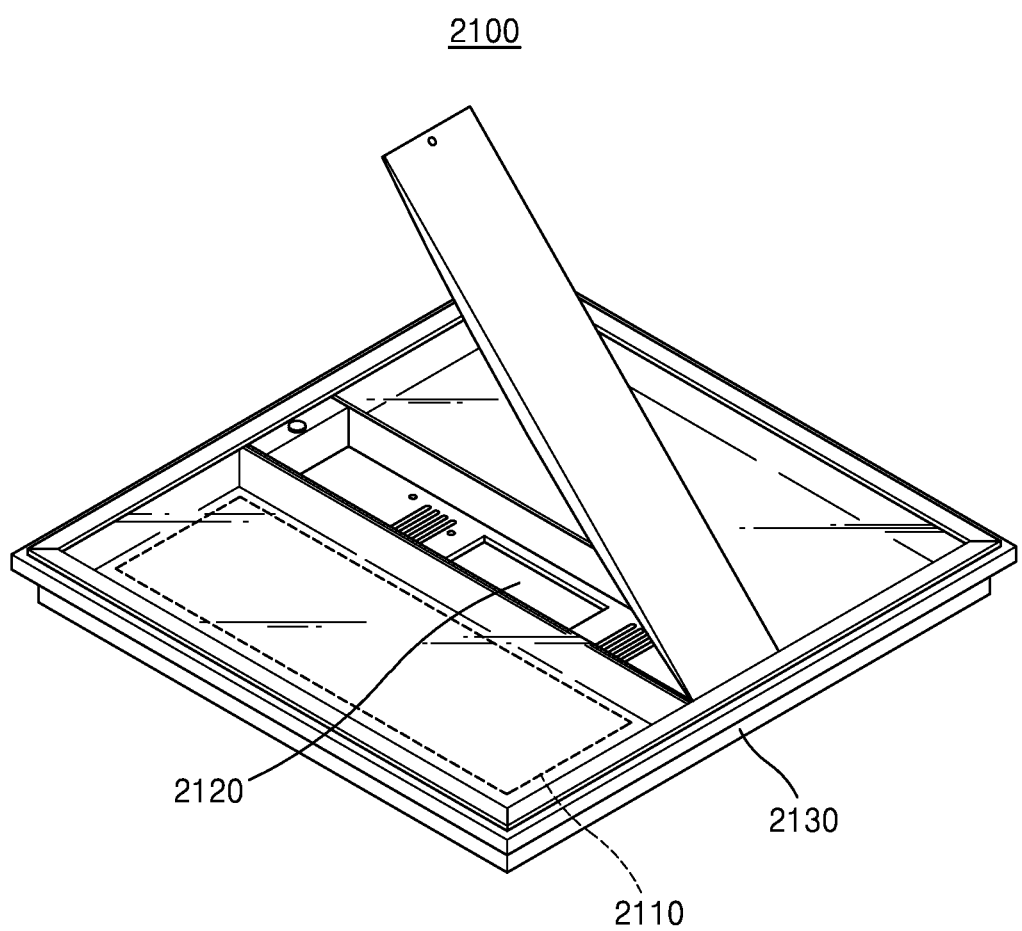
FIG. 29 is a schematic perspective view of a flat panel lighting device including a semiconductor light emitting device according to example embodiments.

FIG. 29 is a schematic perspective view of a flat panel lighting device including a semiconductor light emitting device according to example embodiments.

Referring to FIG. 29, a flat lighting device 2100 may include a light source module 2110, a power supply device 2120, and a housing 2130.

The light source module 2110 may include a light emitting device array as a light source, and may include at least one of the semiconductor light emitting devices 100, 100A, 100B, 100C, 200, 300, and 400 described above as a light source. The light source module 2110 may be formed to have a flat form as a whole.

The power supply device 2120 may be configured to supply power to the light source module 2110. The housing 2130 may have an accommodation space formed to accommodate the light source module 2110 and the power supply device 2120 therein, and is formed in a hexahedral shape open on one side, but is not limited thereto. The light source module 2110 may be disposed to emit light through an open side of the housing 2130.

Figure 30:
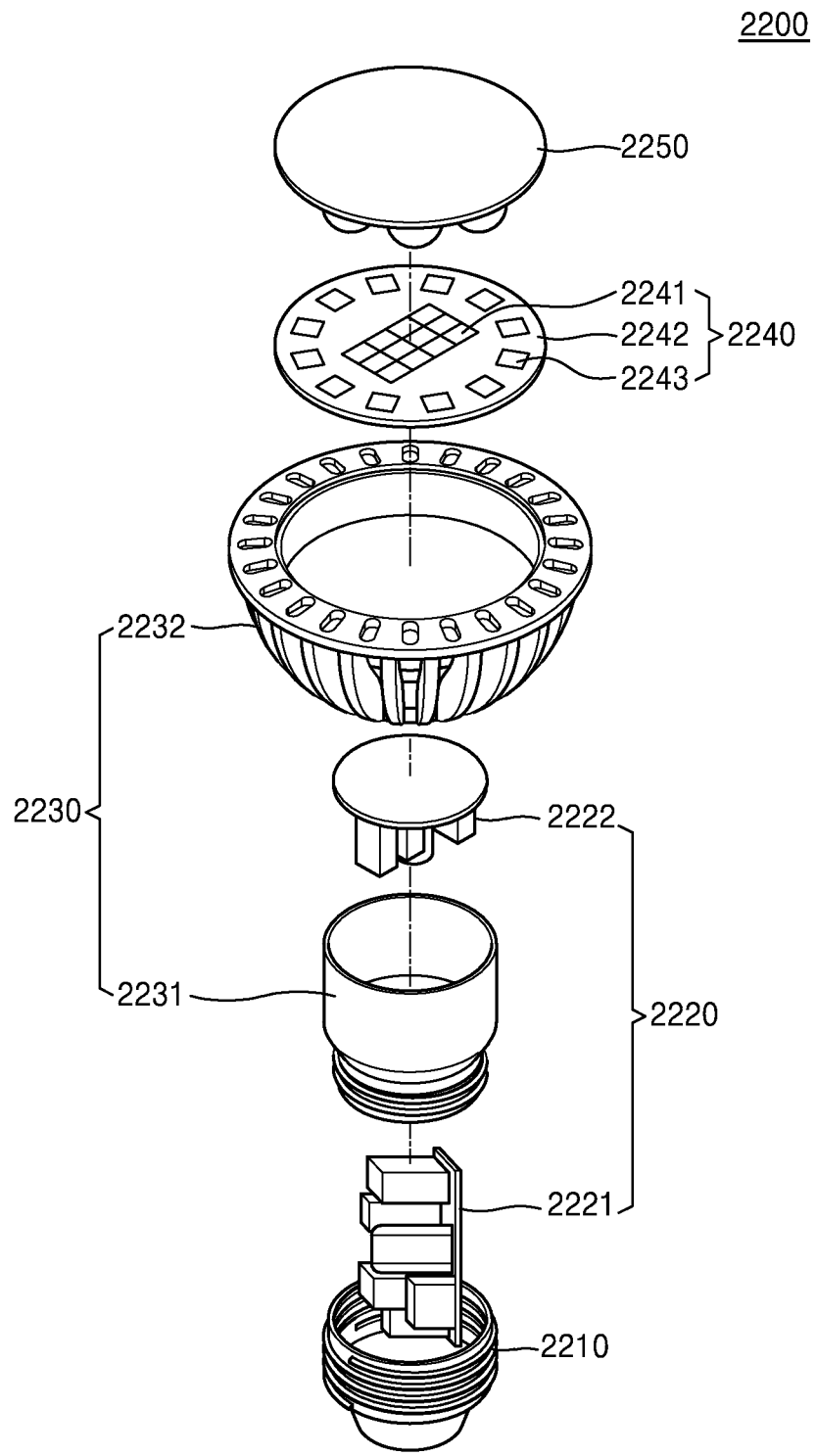
FIG. 30 is an exploded perspective view schematically illustrating a lighting device including a semiconductor light emitting device according to example embodiments.

FIG. 30 is an exploded perspective view schematically illustrating a lighting device including a semiconductor light emitting device according to example embodiments.

Specifically, the lighting device 2200 may include a socket 2210, a power supply unit 2220, a heat dissipation unit 2230, a light source module 2240, and an optical unit 2250.

The socket 2210 may be configured to be replaceable with an existing lighting device. Power supplied to the lighting device 2200 may be applied through the socket 2210. The power supply unit 2220 may be separated into a first power supply unit 2221 and a second power supply unit 2222 and assembled. The heat dissipation unit 2230 may include an internal heat dissipation unit 2231 and an external heat dissipation unit 2232, and the internal heat dissipation unit 2231 may be directly connected to the light source module 2240 and/or the power supply unit 2220, and through this, heat may be transferred to the external heat dissipation unit 2232. The optical unit 2250 may include an internal optical unit and an external optical unit, and may be configured to evenly distribute light emitted by the light source module 2240.

The light source module 2240 may receive power from the power supply unit 2220 and emit light to the optical unit 2250. The light source module 2240 may include one or more light emitting device packages 2241, a circuit board 2242, and a controller 2243, and the controller 2243 may store driving information of the light emitting device package 2241. The light emitting device package 2241 may include at least one of semiconductor light emitting devices 100, 100A, 100B, 100C, 200, 300, and 400.

While example embodiments have been particularly shown and described, it will be understood that various changes in form and details may be made therein without departing from the spirit and scope of the following claims.

What is claimed is:

1. A semiconductor light emitting device comprising:
    a plurality of light emitting structures, each of which comprises a first surface and a second surface, a plurality of embossed portions provided on the first surface;
    a partition wall structure provided on the first surface of the plurality of light emitting structures and comprising a plurality of partition walls which define a plurality of pixel spaces; and
    a fluorescent layer provided in the plurality of pixel spaces,
    wherein a bottom surface of the partition wall structure contacts the plurality of embossed portions.

2. The semiconductor light emitting device of claim 1, wherein a plurality of protrusion portions formed in the partition wall structure conform to the plurality of embossed portions.

3. The semiconductor light emitting device of claim 2, wherein the plurality of protrusion portions are provided along an entire area of the bottom surface of the partition wall structure.

4. The semiconductor light emitting device of claim 1, further comprising a device separation insulating layer provided between two adjacent light emitting structures among the plurality of light emitting structures, the device separation insulating layer covering sidewalls of the plurality of light emitting structures and contacting the bottom surface of the partition wall structure.

5. The semiconductor light emitting device of claim 4, wherein the device separation insulating layer comprises a plurality of protrusion portions, and
wherein the plurality of protrusion portions of the device separation insulating layer contact the bottom surface of the partition wall structure.

6. The semiconductor light emitting device of claim 1, wherein the partition wall structure comprises a photosensitive epoxy resin.

7. The semiconductor light emitting device of claim 1, wherein each of the plurality of embossed portions has a hemispherical shape protruding toward the fluorescent layer from a reference upper surface provided on the first surface.

8. The semiconductor light emitting device of claim 7, wherein each of the plurality of embossed portions has a first width in a first direction parallel to the first surface, and
wherein the first width is in a range of about 50 nanometers to about 20 micrometers.

9. The semiconductor light emitting device of claim 7, wherein the partition wall structure has a first height in a second direction perpendicular to the first surface, and
wherein the first height is in a range of about 5 micrometers to about 300 micrometers.

10. The semiconductor light emitting device of claim 7, wherein the plurality of embossed portions are arranged in a hexagonal structure in a plan view.

11. The semiconductor light emitting device of claim 1, further comprising:
a first insulating layer conformally provided on upper surfaces and sidewalls of the partition wall structure and covering the first surface of the plurality of light emitting structures on a bottom portion of the plurality of pixel spaces;
a sidewall reflector layer on the first insulating layer to cover the sidewalls of the partition wall structure; and
a second insulating layer conformally provided on the upper surfaces and the sidewalls of the partition wall structure to cover the first insulating layer and the sidewall reflector layer.

12. The semiconductor light emitting device of claim 1, further comprising a device separation insulating layer provided between two adjacent light emitting structures among the plurality of light emitting structures, the device separation insulating layer covering sidewalls of the plurality of light emitting structures, and contacting the bottom surface of the partition wall structure,
wherein an upper surface of the device separation insulating layer is flat.

13. The semiconductor light emitting device of claim 12, wherein a portion of the bottom surface of the partition wall structure vertically overlapping the upper surface of the device separation insulating layer is flat.

14. A semiconductor light emitting device comprising:
a plurality of light emitting structures;
a device separation insulating layer provided between two adjacent light emitting structures among the plurality of light emitting structures to cover sidewalls of the plurality of light emitting structures;
a partition wall structure provided on the plurality of light emitting structures and the device separation insulating layer, the partition wall structure comprising a plurality of partition walls defining a plurality of pixel spaces, and the plurality of partition walls comprising a photosensitive epoxy resin; and
a fluorescent layer provided in the plurality of pixel spaces,
wherein a plurality of embossed portions protruding in a direction toward the fluorescent layer are provided on the plurality of light emitting structures, and
wherein a first plurality of protrusion portions protruding in the direction toward the partition wall structure are provided on the device separation insulating layer.

15. The semiconductor light emitting device of claim 14, wherein a second plurality of protrusion portions formed on a bottom surface of the partition wall structure conform to the plurality of embossed portions.

16. The semiconductor light emitting device of claim 14, wherein each of the plurality of embossed portions has a hemispherical shape protruding toward the fluorescent layer from a reference upper surface of the plurality of light emitting structures.

17. The semiconductor light emitting device of claim 14, wherein an upper surface of the device separation insulating layer is flat, and
wherein a portion of a bottom surface of the partition wall structure contacting the upper surface of the device separation insulating layer is flat.

18. A semiconductor light emitting device comprising:
a support substrate;
a plurality of light emitting structures provided on the support substrate and spaced apart from each other by a device separation area;
a device separation insulating layer provided in the device separation area to cover sidewalls of the plurality of light emitting structures;
a partition wall structure provided on the plurality of light emitting structures and comprising a plurality of partition walls, wherein the plurality of partition walls define a plurality of pixel spaces, and the plurality of pixel spaces vertically overlap the plurality of light emitting structures, respectively;
a fluorescent layer provided in the plurality of pixel spaces; and
a pad portion provided on a side of the plurality of light emitting structures,
wherein a plurality of embossed portions which protrude in a direction toward the fluorescent layer are formed on the plurality of light emitting structures, and
wherein a plurality of protrusion portions which protrude in the direction toward the partition wall structure are formed on the device separation insulating layer.

19. The semiconductor light emitting device of claim 18, further comprising:
a sidewall reflector layer provided on a sidewall of the partition wall structure; and
a lower reflector layer provided on an inner wall of the device separation area between two adjacent light emitting structures among the plurality of light emitting structures and vertically overlapping the plurality of partition walls,
wherein the partition wall structure comprises a photosensitive epoxy resin.

* * * * *